(12) United States Patent
Quinsat et al.

(10) Patent No.: US 10,141,067 B2
(45) Date of Patent: Nov. 27, 2018

(54) MAGNETIC MEMORY DEVICE

(71) Applicant: TOSHIBA MEMORY CORPORATION, Tokyo (JP)

(72) Inventors: Michael Arnaud Quinsat, Kanagawa (JP); Tsuyoshi Kondo, Kanagawa (JP); Hirofumi Morise, Kanagawa (JP); Takuya Shimada, Kanagawa (JP); Yasuaki Ootera, Kanagawa (JP); Masaki Kado, Kanagawa (JP); Shiho Nakamura, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/252,936

(22) Filed: Aug. 31, 2016

(65) Prior Publication Data

US 2017/0263329 A1      Sep. 14, 2017

(30) Foreign Application Priority Data

Mar. 9, 2016    (JP) .................................. 2016-045661

(51) Int. Cl.
   *G11C 19/08*          (2006.01)
(52) U.S. Cl.
   CPC ............................ *G11C 19/0833* (2013.01)
(58) Field of Classification Search
   CPC .............................................. G11C 19/0833
   (Continued)

(56) References Cited

U.S. PATENT DOCUMENTS 8,300,456 B2 * 10/2012 Honjou ................... H01L 43/08
                                                       257/421
8,792,271 B2 *  7/2014 Morise ..................... G11C 11/16
                                                       365/148
(Continued)

FOREIGN PATENT DOCUMENTS

JP          2005-100562          4/2005
JP          2015-51765           3/2015
                  (Continued)

OTHER PUBLICATIONS

Zhou. Y. , et al., "A reversible conversion between a skyrmion and a domain-wall pair in a junction geometer", Nature Communication, 5:4652 (2014), pp. 1-8.*

(Continued)

*Primary Examiner* — Son Mai
*Assistant Examiner* — Muna A Techane
(74) *Attorney, Agent, or Firm* — Finnegan, Henderson, Farabow, Garrett & Dunner, L.L.P.

(57) ABSTRACT

According to the embodiment, a magnetic memory device includes a magnetic body. The magnetic body includes first and second extending regions, and a first connecting region. The first extending region spreads along a first direction and along a second direction crossing the first direction, and includes first and second end portions extending in the first direction. The second end portion is separated from the first end portion in the second direction. The second extending region spreads along the first direction and along a third direction crossing the first direction, and includes third and fourth end portions extending in the first direction. The fourth end portion is separated from the third end portion in the third direction. The first connecting region is provided between the first and third end portions, and connects the first end portion with the third end portion.

19 Claims, 16 Drawing Sheets

(58) Field of Classification Search
USPC .......................................................... 365/80
See application file for complete search history.

(56) References Cited

U.S. PATENT DOCUMENTS

| | | | |
|---|---|---|---|
| 2005/0146469 A1 | 7/2005 | Sampo | |
| 2006/0227466 A1* | 10/2006 | Yagami | B82Y 25/00 |
| | | | 360/324.2 |
| 2012/0250398 A1* | 10/2012 | Morise | G11C 11/14 |
| | | | 365/157 |
| 2013/0250668 A1* | 9/2013 | Fukuzawa | G11C 11/161 |
| | | | 365/158 |
| 2016/0052539 A1 | 2/2016 | Ueno et al. | |
| 2016/0055892 A1* | 2/2016 | Shimada | G11C 11/161 |
| | | | 365/66 |

FOREIGN PATENT DOCUMENTS

| | | |
|---|---|---|
| WO | WO 2015/111681 A1 | 7/2015 |
| WO | WO 2015/137335 A1 | 9/2015 |

OTHER PUBLICATIONS

Tanaka, M.A., et al, "Study of current-induced dynamics of bubbies domains in TbFeCo wires", Annual Conference on Magnetics in apan by the Magnetics Society of Japan (2014), pp. 75.*

Zhou. Y., et al., "A reversible conversion between a skyrmion and a domain-wall pair in a junction geometry", Nature Communications, 5:4652 (2014), pp. 1-8.

Tanaka, M.A., et al., "Study of current-induced dynamics of bubble domains in TbFeCo wires", Annual Conference on Magnetics in Japan by the Magnetics Society of Japan (2014), pp. 75.

* cited by examiner

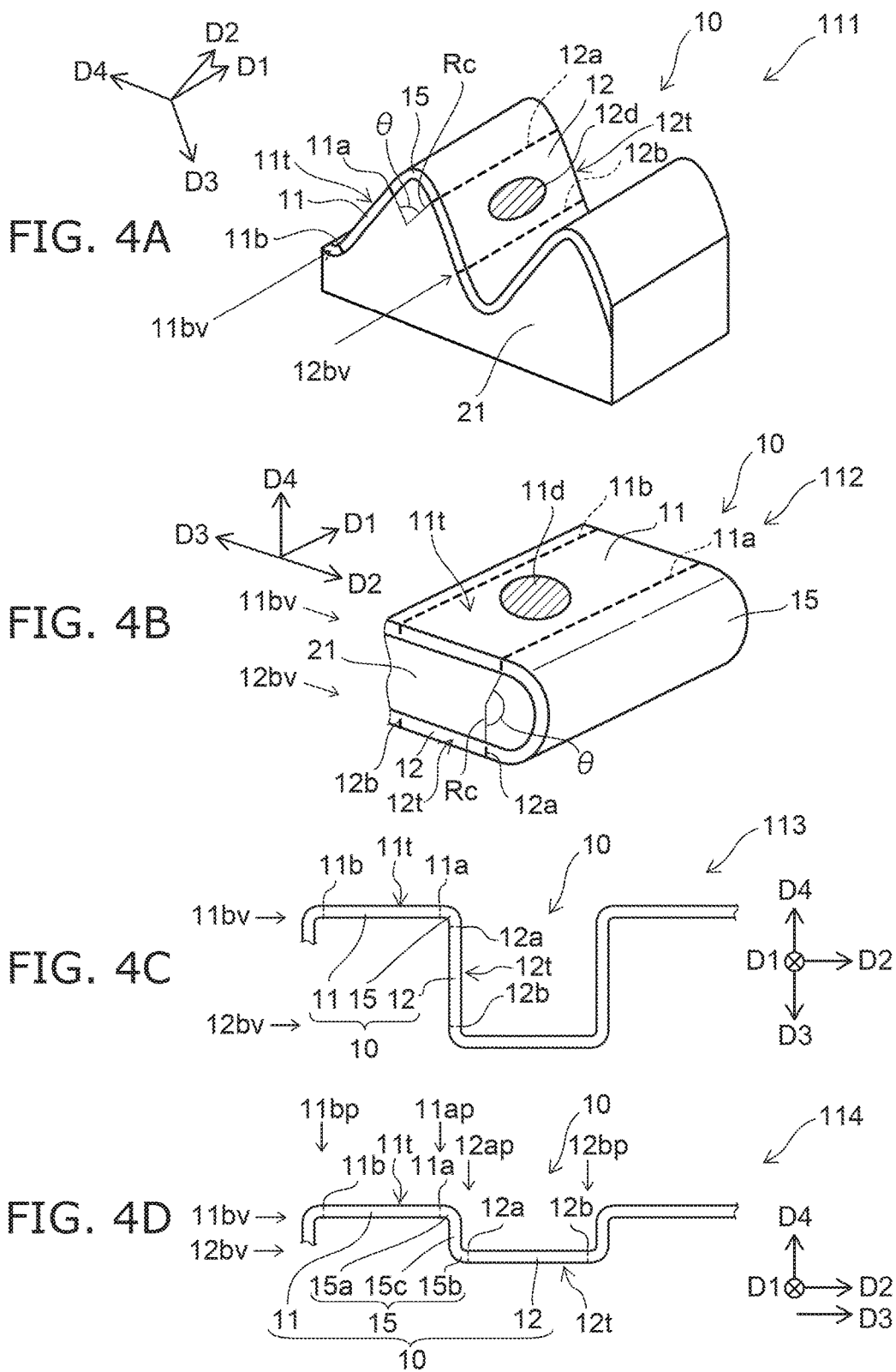

MAGNETIC MEMORY DEVICE

CROSS-REFERENCE TO RELATED APPLICATIONS

This application is based upon and claims the benefit of priority from Japanese Patent Application No. 2016-045661, filed on Mar. 9, 2016; the entire contents of which are incorporated herein by reference.

FIELD

Embodiments described herein relate generally to a magnetic memory device.

BACKGROUND

There is a magnetic memory device including a magnetic shift register using a magnetic material. Improvement of memory density is required for the magnetic memory device.

BRIEF DESCRIPTION OF THE DRAWINGS

FIG. 4A to FIG. 4D are schematic views illustrating portions of other magnetic memory devices according to the first embodiment;

DETAILED DESCRIPTION

Figure 1A:
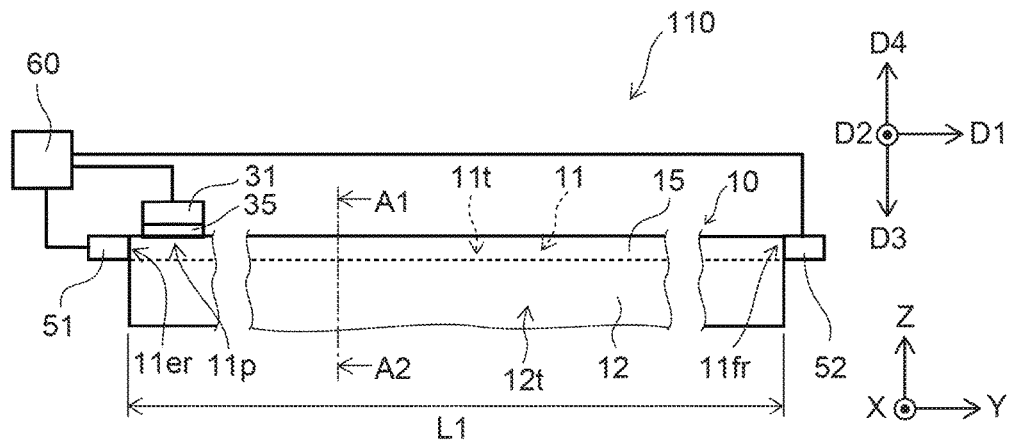
FIG. 1A to FIG. 1C are schematic views illustrating a magnetic memory device according to a first embodiment.

According to one embodiment, a magnetic memory device includes a magnetic body. The magnetic body includes a first extending region, a second extending region, and a first connecting region. The first extending region spreads along a first direction and along a second direction crossing the first direction. The first extending region includes a first end portion extending in the first direction and a second end portion extending in the first direction and separated from the first end portion in the second direction. The second extending region spreads along the first direction and along a third direction crossing the first direction. The second extending region includes a third end portion extending in the first direction and a fourth end portion extending in the first direction and separated from the third end portion in the third direction. The first connecting region is provided between the first end portion and the third end portion. The first connecting region connects the first end portion with the third end portion. A position of the second end portion along a fourth direction is different from a position of the fourth end portion along the fourth direction. The fourth direction is perpendicular to the first direction and the second direction. The first extending region includes a first magnetic domain and a first other region provided around the first magnetic domain in a first state.

According to one embodiment, a magnetic memory device includes a first extending region, a second extending region, and a first connecting region. The first extending region extends along a first direction. The first extending region has a first curvature radius in a cross section of the first extending region by a plane perpendicular to the first direction. The second extending region extends along the first direction and is arranged with the first extending region in a second direction crossing the first direction. The first connecting region extends in the first direction and connects the first extending region with the second extending region. The first connecting region has a connecting region curvature radius in a cross section of the first connection region by the plane. The connecting region curvature radius is smaller than the first curvature radius. The first extending region includes a first magnetic domain and a first other region provided around the first magnetic domain in a first state.

According to one embodiment, a magnetic memory device includes a first extending region, a second extending region, and a first connecting region. The first extending region extends along a first direction. The second extending region extends along the first direction and is arranged with the first extending region in a second direction crossing the first direction. The first connecting region connects the first extending region with the second extending region. The first connecting region recesses or protrudes with respect to the first extending region and recesses or protrudes with respect to the second extending region. The first extending region includes a first magnetic domain and a first other region provided around the first magnetic domain in a first state.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

First Embodiment

Figures 1B, 1C:
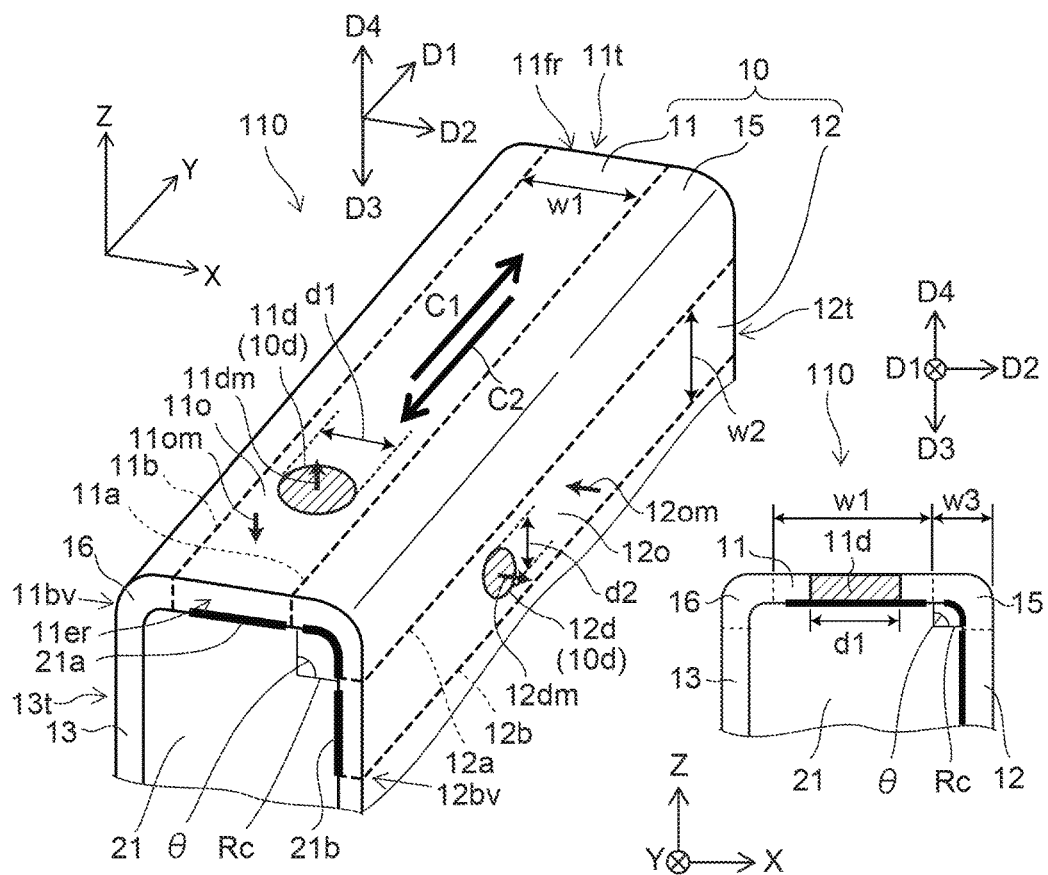

FIG. 1A to FIG. 1C are schematic views illustrating a magnetic memory device according to a first embodiment.

FIG. 1A is a side view. FIG. 1B is a perspective view showing a portion of the magnetic memory device. FIG. 1C is an A1-A2 line sectional view of FIG. 1A.

As shown in FIG. 1A, the magnetic memory device 110 according to the embodiment includes a magnetic body 10, a first electrode 51, a second electrode 52, a first counter body 31, and a controller 60.

FIG. 1B illustrates the magnetic body 10. The magnetic body 10 includes a first extending region 11, a second extending region 12, and a first connecting region 15. In this example, the magnetic body 10 further includes a third extending region 13 and a second connecting region 16.

The first extending region 11 spreads along a first direction D1 and a second direction D2. The second direction D2 crosses the first direction D1. The first extending region 11 includes a first end portion 11a and a second end portion 11b. The first end portion 11a extends in the first direction D1. The second end portion 11b extends in the first direction D1. The second end portion 11b is separated from the first end portion 11a in the second direction D2.

The second extending region 12 spreads along the first direction D1 and the third direction D3. The third direction D3 crosses the first direction D1. The second extending region 12 includes a third end portion 12a and a fourth end portion 12b. The third end portion 12a extends in the first direction D1. The fourth end portion 12b extends in the first direction D1. The fourth end portion 12b is separated from the third end portion 12a in the third direction D3.

The first connecting region 15 is provided between the first end portion 11a and the third end portion 12a. The first connecting region 15 connects the first end portion 11a with the third end portion 12a. The first connecting region 15 extends along the first direction D1, for example.

The first direction D1 is taken as a Y-axis direction. One direction perpendicular to the Y-axis direction is taken as an X-axis direction. A direction perpendicular to the Y-axis direction and the X-axis direction is taken as a Z-axis direction.

In this example, the second direction D2 is along the X-axis direction. The third direction D3 is along the Z-axis direction. A direction perpendicular to the first direction D1 and the second direction D2 is taken as a fourth direction D4. In this example, the fourth direction D4 is along the Z-axis direction. In this example, the third direction D3 crosses the second direction D2. An angle between the third direction D3 and the second direction D2 is about 90 degrees.

In the embodiment, a position 11bv of the second end portion 11b along the fourth direction D4 is different from a position 12bv of the fourth end portion 12b along the fourth direction D4.

In this example, the second extending region 12 is not along a plane in which the first extending region 11 is included. A plane in which the second extending region 12 is included crosses the plane in which the first extending region 11 is included. The magnetic body 10 is bent at the first connecting region 15.

The first extending region 11 is continuous with the first connecting region 15. The second extending region 12 is continuous with the first connecting region 15. The continuous magnetic body 10 is bent at the first connecting region 15.

The third extending region 13 extends along the first direction D1. The second connecting region 16 is provided between the third extending region 13 and the first extending region 11 (the second end portion 11b). The second connecting region 16 connects the third extending region 13 with the first extending region 11 (the second end portion 11b).

For example, the magnetic body 10 can hold a plurality of magnetic domains 10d. For example, a portion of the plurality of magnetic domains 10d is provided in the first extending region 11. Another portion of the plurality of magnetic domains 10d is provided in the second extending region 12. Another portion of the plurality of magnetic domains 10d is provided in the third extending region 13.

For example, the first extending region 11 includes a first magnetic domain 11d and a first other region 11o in a first state. The first other region 11o is provided around the first magnetic domain 11d. The first magnetic domain 11d is one of the plurality of magnetic domains 10d.

Magnetization 11dm of the first magnetic domain 11d is different from magnetization 11om of the first other region 11o. For example, a direction of the magnetization of 11dm of the first magnetic domain 11d is different from a direction of magnetization 11om of the first other region 11o. For example, the direction of magnetization 11dm is contrary to the direction of magnetization 11om.

For example, the second extending region 12 includes a second magnetic domain 12d and a second other region 12o in a certain state (for example, second state). The second other region 12o is provided around the second magnetic domain 12d. The second magnetic domain 12d is one of the plurality of magnetic domains 10d.

Magnetization 12dm of the second magnetic domain 12d is different from magnetization 12om of the second other region 12o. For example, a direction of the magnetization 12dm of the second magnetic domain 12d is different from a direction of magnetization 12om of the second other region 12o. The direction of magnetization 12dm is contrary to the direction of magnetization 12om.

For example, the magnetic body 10 is a perpendicular magnetized film. The magnetization of the first extending region 11 is along a direction (the fourth direction D4, for example) perpendicular to the first direction D1 and the second direction D2. On the other hand, the magnetization of the second extending region 12 is along a direction perpendicular to the first direction D1 and the third direction D3.

For example, in the first extending region 11, the magnetization 11dm of the first magnetic domain 11d is along the fourth direction D4. On the other hand, in the second extending region 12, the magnetization 12dm of the second magnetic domain 12d is along a direction perpendicular to the first direction D1 and the third direction D2.

The magnetic body 10 holds information. For example, a plurality of magnetic domains 10d correspond to information. For example, a state where the magnetic domain 10d is disposed in a predetermined position of the magnetic body 10 corresponds to first information. A state where the magnetic domain 10d is not disposed in the predetermined position corresponds to second information. In this state, another region is disposed in that predetermined position, for example. This other region is the first other region 11o or the second other region 12o, for example. The first information corresponds to "1", for example. The second information corresponds to "0", for example.

The plurality of magnetic domains 10d can move in the magnetic body 10. For example, the first magnetic domain 11d provided in the first extending region 11 can move in the first extending region 11. The second magnetic domain 12d provided in the second extending region 12 can move in the second extending region 12. For example, the magnetic domain 10d moves according to a current flown through the magnetic body 10. For example, a current is supplied by the first electrode 51 and the second electrode 52. At least one of recording (writing) and reading of information is performed by the first counter body 31. The first counter body 31 is magnetic, for example. The controller 60 controls these elements. The controller 60 is electrically connected with these elements, for example. The examples of the first electrode 51, the second electrode 52, the first counter body 31, and the controller 60 are described later.

In the embodiment, the continuous magnetic body 10 is bent at the first connecting region 15. Thereby, the magnetic domain 10d is not moved to other extending region across the first connecting region 15. For example, the first magnetic domain 11d is not moved to the second extending region 12. The second magnetic domain 12d is not moved to the first extending region 11.

There is an example of reference from which a plurality of extending regions are separated mutually. These extending region are not connected by the connecting region. In this example of reference, the magnetic domain 10d of one extending region is not moved to other extending region. Thereby, the operation of recording/reading of information is stable. However, in this example of reference, since the plurality of extending regions are separated mutually, manufacturing is difficult. The down-scaling is difficult. It is difficult to improve the memory density.

On the other hand, in the embodiment, the continuous magnetic body 10 is bent at the first connecting region 15. Thereby, the magnetic domain 10d (for example, the first magnetic domain 11d) of one extending region is suppressed from moving to other extending region. Since the magnetic body 10 is continuous, manufacturing is easy. According to the embodiment, the memory density can be improved.

The first extending region 11 is included in a first magnetic track 11t. The second extending region 12 is included in a second magnetic track 12t. The third extending region 13 is included in a third magnetic track 13t. In these magnetic tracks, the magnetic domains 10d move in the first direction D1. The magnetic body 10 is a memory element, for example.

In the embodiment, a size of the plurality of magnetic domains 10d is smaller than each width of the plurality of extending regions.

As shown in FIG. 1B and FIG. 1C, the first magnetic domain 11d has a first domain width d1 along the second direction D2. On the other hand, the first extending region 11 has a first distance w1 (width). The first distance w1 is a distance between the first end portion 11a and the second end portion 11b along the second direction D2. In the embodiment, the first domain width d1 is smaller than the first distance w1. The first domain width d1 may be not more than 0.5 times the first distance w1, for example.

The second magnetic domain 12d has a second domain width d2 along the third direction D3. On the other hand, the second extending region 12 has a second distance w2 (width). The second distance w2 is a distance between the third end portion 12a and the fourth end portion 12b along the third direction D3. In the embodiment, the second domain width d2 is smaller than the second distance w2. The second domain width d2 may be not more than 0.5 times the second distance w2, for example.

On the other hand, in the first connecting region 15, it is preferable that the magnetic body 10 is bent with a high curvature. For example, a width w3 of the first connecting region 15 along the second direction D2 is smaller than the first distance w1. For example, the width w3 of the first connecting region 15 along the second direction D2 may be not more than 1/7.5 times the first distance w1. The width w3 may be not less than the domain width d1.

For example, the first connecting region 15 has a connecting region curvature radius Rc. The first connecting region 15 has a section in a perpendicular plane to the first direction D1. In this example, this plane is an X-Z plane. The connecting region curvature radius Rc is a curvature radius of the first connecting region 15 in the section of this first connecting region 15.

For example, the first connecting region 15 is curved. In this example, an angle θ of a curve is about 90 degrees. The angle θ is arbitrary.

In this example, a base body 21 is further provided. The first extending region 11 is provided on a first face 21a of the base body 21. The second extending region 12 is provided on a second face 21b of the base body 21. The base body 21 holds the magnetic body 10. For example, unevenness (trench) is provided in the surface of the base body 21. A magnetic film is formed on this unevenness. The magnetic body 10 is formed of the magnetic film.

In the embodiment, the first distance w1 is not less than 10 nm and not more than 100 nm, for example. A length L1 (refer to FIG. 1A) of the first extending region 11 along the first direction D1 is longer than the first distance w1. The length L1 is not less than 2 times the first distance w1, for example. The length L1 may be not more than 100000 times the first distance w1, for example.

In this example, the base body 21 is insulative. In this case, the first electrode 51 and the second electrode 52 are electrically connected to the magnetic body 10.

As shown in FIG. 1A, the first extending region 11 includes a first end region 11er and a second end region 11fr. The second end region 11fr is arranged with the first end region 11er in the first direction D1, for example. The second electrode 52 is arranged with the first electrode 51 in the first direction D1. The first electrode 51 is connected to the first end region 11er. The second electrode 52 is connected to the second end region 11fr. The first electrode 51 is provided above or below the magnetic body 10. The second electrode 52 is provided above or below the magnetic body 10.

The first electrode 51 and the second electrode 52 send current through the magnetic body 10. For example, a current flows through the magnetic body 10 along the first direction D1.

The current is at least one of a current c1 and a current c2. The current c1 flows toward the second end region 11fr from the first end region 11er. The current c2 flows toward the first end region 11er from the second end region 11fr. In this example, these currents flow through the first extending region 11 along the first direction D1.

By these current, the first magnetic domain 11d moves along the first direction D1 in the first extending region 11.

The controller 60 controls a potential of the first electrode 51, and a potential of the second electrode 52. Thereby, the current is controlled. The current is a pulse-like, for example. The current may be continuous. The position of the first magnetic domain 11d in the first extending region 11 changes in accordance with the current. The first extending region 11 serves as a shift register, for example. The controller 60 may be a source of electrical current. The source of electrical current provides an electrical current to the magnetic body 10 (for example, the first extending region 11 and the second extending region 12, etc.).

The first extending region 11 has a first part 11p, for example. The first part 11p corresponds to a reading position, for example. In the first part 11p, recording may be further performed.

The first counter body 31 is separated from the first part 11p of the first extending region 11 in the fourth direction D4. In this example, the first counter body 31 is a magnetic layer. In this example, a first intermediate layer 35 is provided between the first counter body 31 and the first part 11p. The first counter body 31 may be a probe, for example.

An electrical resistance between the first counter body 31 and the first part 11p changes depending on the state of the magnetization in the first part 11p. The electrical resistance is based on a magneto-resistive effect, for example.

FIG. 2A to FIG. 2D are schematic views illustrating states of the magnetic memory device according to the first embodiment.

These figures illustrate the mutually different states of the magnetic memory device 110. These states correspond to different operating states. In these figures, the magnetic body 10 and the first counter body 31 are illustrated, and other elements are omitted.

Figures 2A, 2B:
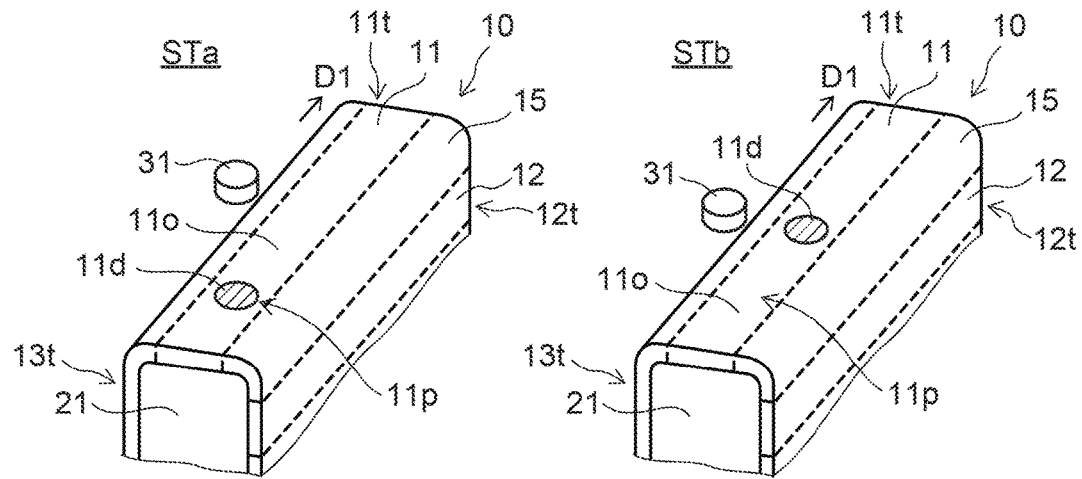
FIG. 2A to FIG. 2D are schematic views illustrating states of the magnetic memory device according to the first embodiment.

As shown in FIG. 2A, in a state STa, the first extending region 11 includes the first magnetic domain 11d and the first other region 11o. The first magnetic domain is located in the first part 11p in this example. For example, the state STa corresponds to the first state.

As shown in FIG. 2B, in a state STb, the first magnetic domain 11d moves in the first extending region 11. This movement is performed by a current, for example. In the state STb, the first other region 11o is located in the first part 11p. For example, the state STb may correspond to the first state.

In the embodiment, the electrical resistance changes between the state STa and the state STb. For example, the electrical resistance between the first extending region 11 and the first counter body 31 is different between these states. This electrical resistance in the state STa (state where the first magnetic domain 11d is located in the first part 11p of the first extending region 11) is different from the electrical resistance in the state STb (state where the first other region 11o is located in the first part 11p of the first extending region 11). The magnetization 11dm of the first magnetic domain 11d is different from the magnetization 11om of the first other region 11o. Thereby, change of the electrical resistance occurs.

This operation corresponds to a reading operation of information. For example, the first magnetic domain 11d corresponds to "1." The first other region 11o corresponds to "0."

The first counter body 31 may further perform a recording operation other than the reading operation. In the recording operation, the addition of the magnetic domain 10d is performed, for example. The information on "1" is recorded at this time. Or for example, one of the magnetic domains is removed. "0" is recorded at this time. Or, the information is erased.

Figures 2C, 2D:
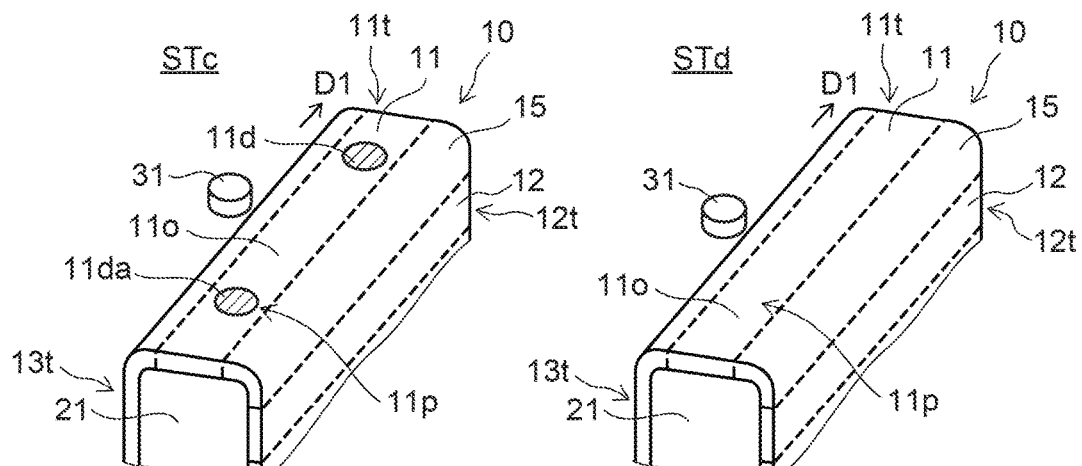

As shown in FIG. 2C, the first counter body 31 generates one other magnetic domain 11da in the first extending region 11. The first other region 11o is further provided around the one other magnetic domain 11da. Thereby, "1" is recorded. This operation is taken as a first operation. In this state STc, the first magnetic domain 11d moves from the position in the state STa. In the state STc, the "1" by the first magnetic domain 11d and the "1" by the one other magnetic domain 11da are recorded.

As shown in FIG. 2D, the first counter body 31 removes the first magnetic domain 11d from the first extending region 11. Thereby, the state (state STd) different from the first state (state STa) is generated. This operation is taken as a second operation. The second operation corresponds to recording of "0." The second operation corresponds to the erasing operation.

The first counter body 31 performs at least one of the first operation and the second operation, for example. Thus, in this example, the first counter body 31 performs the reading operation and the recording operation. The recording operation includes the erasing operation.

Figure 3:
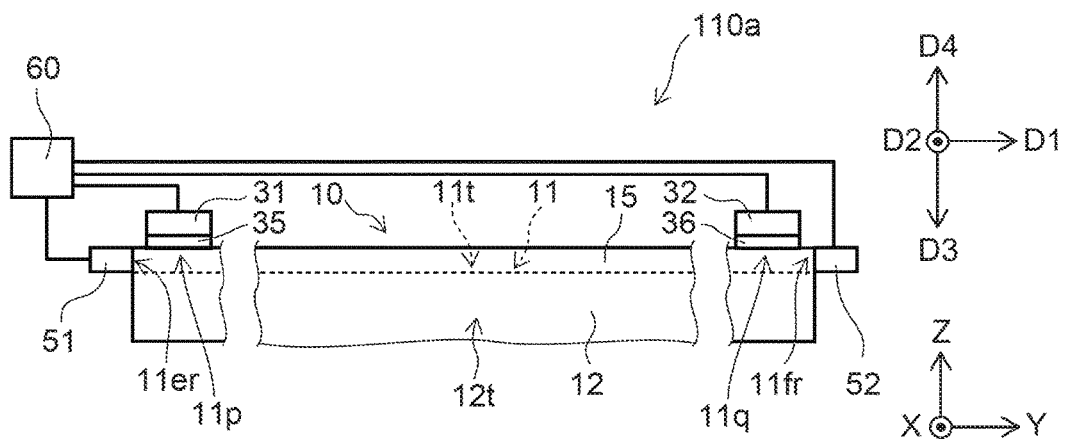
FIG. 3 is a schematic view illustrating one other magnetic memory device according to the first embodiment.

FIG. 3 is a schematic view illustrating one other magnetic memory device according to the first embodiment.

FIG. 3 is a side view.

As shown in FIG. 3, in addition to the magnetic body 10, the first electrode 51, the second electrode 52, the first counter body 31, and the controller 60, a second counter body 32 is provided in one other magnetic memory device 110a according to the embodiment. Since the magnetic body 10, the first electrode 51, the second electrode 52, the first counter body 31, and the controller 60 are the same as those of the magnetic memory device 110, the descriptions for them are omitted.

The second counter body 32 is separated from a second part 11q of the first extending region 11 along the fourth direction D4. In the first direction D1, the second part 11q is arranged with the first part 11p.

The second counter body 32 is magnetic, for example. In this example, the second counter body 32 is a magnetic layer. In this example, a second intermediate layer 36 is provided between the second counter body 32 and the second part 11q. The second counter body 32 may be a probe, for example.

The second counter body 32 performs the recording operation, for example. The recording operation includes the erasing operation. The second counter body 32 performs at least one of the first operation and the second operation, for example. In the first operation, the second counter body 32 generates the one other magnetic domain 11da in the first extending region 11 (same as FIG. 2C). The first other region 11o is further provided around the one other magnetic domain 11da. In the second operation, the second counter body 32 removes the first magnetic domain 11d from the first extending region 11 (same as FIG. 2D). Thereby, the state different from the first state is generated.

In the magnetic memory device 110a, the first counter body 31 performs a reproduction operation. The first counter body 31 may further perform the recording operation. The recording operation may also include the erasing operation.

In the magnetic memory devices 110 and 110a, the magnetization 11dm of the first magnetic domain 11d corresponds to the first information to be memorized. The magnetization 11*om* of the first other region 11*o* corresponds to the second information to be memorized.

In the magnetic memory devices 110 and 110*a*, the first magnetic domain 11*d* moves along the first direction D1 in the first extending region 11 according to the current which flows through the first extending region 11. This current flows along the first direction D1 all over the first extending region 11.

In the embodiment, the magnetic body 10 includes at least one of Magnesium (Mg), Aluminum (Al), Silicon (Si), Titanium (Ti), Vanadium (V), Chromium (Cr), Manganese (Mn), Cobalt (Co), Nickel (Ni), Iron (Fe), Zirconium (Zr), Ruthenium (Ru), Platinum (Pt), palladium (Pd), Terbium (Tb), Gadolinium (Gd), Selenium (Se), Germanium (Ge), copper (Cu), Boron (B) Iridium (Ir), and Hafnium (Hf), for example.

At least one of the first counter body 31 and the second counter body 32 includes at least one of Manganese (Mn), Cobalt (Co), Nickel (Ni), and Iron (Fe).

At least one of the first electrode 51 and the second electrode 52 includes at least one of Aluminum (Al), copper (Cu), Silver (Ag), Platinum (Pt), Gold (Au) Hafnium (Hf), Tantalum (Ta) and Tungsten (W).

At least one of the intermediate layer 35 and the intermediate layer 36 includes at least one of Magnesium (Mg), Magnesium oxide (MgO), Alumina oxide (AlO), Silicon dioxide (SiO2), Copper (Cu), Gold (Au), Iridium (Ir), Hafnium (Hf), Tantalum (Ta), Tungsten (W), Ruthenium (Ru), and Bismuth (Bi).

The insulative base body 21 includes at least one of silicon oxide, silicon nitride, silicon oxynitride, and aluminum oxide, for example.

The conductive base body 22 includes at least one of Aluminum (Al), copper (Cu), Silver (Ag), Platinum (Pt), palladium (Pd), Gold (Au), Iridium (Ir), Hafnium (Hf), Tantalum (Ta), Tungsten (W), Ruthenium (Ru), Bismuth (Bi), and Rhodium (Rh), for example.

In the embodiment, the plurality of magnetic domains 10*d* (for example, the first magnetic domain 11*d*) may be a plurality of Skyrmions. The magnetic material used for the magnetic body 10*d* has the perpendicular magnetization anisotropy K, for example. The easy axis of magnetization of magnetic body material is substantially perpendicular to the X-Y plane (the D1-D2 plane in the first extending region 11), for example. This magnetic material has an exchange stiffness constant "A." This magnetic material further has a coefficient "D" of Dzyaloshinski Moriya Interaction. The radius r1 of Skyrmion is expressed by $$r1 = \pi A/|D|.$$

"$\pi$" is a circular constant. The exchange stiffness constant "A" is 0.1 pJ/m to 50 pJ/m, for example. The coefficient "D" is 0.001 mJ/m$^2$ to 10mJ/m$^2$, for example. The coefficient "D" can be negative for example. The radius r1 is not less than 1 nm and not more than 5000 nm, for example. The radius r1 is not less than 10 nm and not more than 200 nm, for example.

For example, when the exchange stiffness constant "A" is 2 pJ/m and the coefficient "D" is 1.25mJ/m$^2$, the radius r1 is 8 nm.

At this time, the first distance w1 and the radius r1 may satisfy the relations "2r1<w1<15r1".

When the first domain width d1 is twice the radius r1, for example, the first distance w1 and the first domain width d1 may satisfy the relations "d1<w1<7.5d1".

Thereby, for example all over the first extending region 11, the controllability of the position of the first magnetic domain 11*d* increases.

Hereinafter, other examples of the magnetic body 10 are described about the magnetic memory device according to the embodiment.

FIG. 4A to FIG. 4D are schematic views illustrating portions of other magnetic memory devices according to the first embodiment.

In these figures, the magnetic body 10 is illustrated and the first electrode 51, the second electrode 52, the first counter body 31, and the controller 60 are omitted.

In these examples, the second counter body 32 may be provided.

As shown in FIG. 4A, the magnetic body 10 in a magnetic memory device 111 also includes the first extending region 11, the second extending region 12, and the first connecting region 15. Also in this case, the third direction D3 crosses the second direction D2. In this example, the angle between the third direction D3 and the second direction D2 is smaller than 90 degrees. The first connecting region 15 is curved. The angle θ of a curve is smaller than 90 degrees.

As shown in FIG. 4B, the magnetic body 10 in a magnetic memory device 112 also includes the first extending region 11, the second extending region 12, and the first connecting region 15. In this case, the third direction D3 is along the second direction D2. At least one copy of the second extending region 12 overlaps the first extending region 11 in the fourth direction D4. The magnetic body 10 is folded at the first connecting region 15. The first connecting region 15 is curved. The angle θ of a curve is about 180 degrees.

As shown in FIG. 4C, the magnetic body 10 in a magnetic memory device 113 also includes the first extending region 11, the second extending region 12, and the first connecting region 15. In this case, the third direction D3 is substantially perpendicular to the second direction D2. A group including the first extending region 11, the first connecting region 15, and the second extending region 12 is disposed repeatedly in a plurality.

As shown in FIG. 4D, the magnetic body 10 in a magnetic memory device 114 also includes the first extending region 11, the second extending region 12, and the first connecting region 15. In this example, the third direction D3 is along the second direction D2. A position 11*ap* of the first end portion 11*a* along the second direction D2 is positioned between a position 11*bp* of the second end portion 11*b* along the second direction D2 and a position 12*bp* of the fourth end portion 12*b* along the second direction D2. The position 12*ap* of the third end portion 12*a* along the second direction D2 is positioned between the position 11*ap* of the first end portion 11*a* along the second direction D2 and the position 12*bp* of the fourth end portion 12*b* along the second direction D2.

In this example, the first connecting region 15 includes a first curve part 15*a*, a second curve part 15*b*, and a connecting area 15*c*. The first curve part 15*a* is connected with the first end portion 11*a*. The second curve part 15*b* is connected with the third end portion 12*a*. The connecting area 15*c* is connected with the first curve part 15*a* and the second curve part 15*b*. In this example, the first connecting region 15 has two curve parts.

Also in the magnetic memory devices 111-113, the position 11*bv* of the second end portion 11*b* along the fourth direction D4 is different from the position 12*bv* of the fourth end portion 12*b* along the fourth direction D4. The magnetic body 10 is bent at the first connecting region 15. Thereby, the first magnetic domain 11*d* is suppressed from moving to the second extending region 12. Since the magnetic body 10 is continuous, manufacturing is easy. The memory density can be improved also in these examples.

Figure 5A:
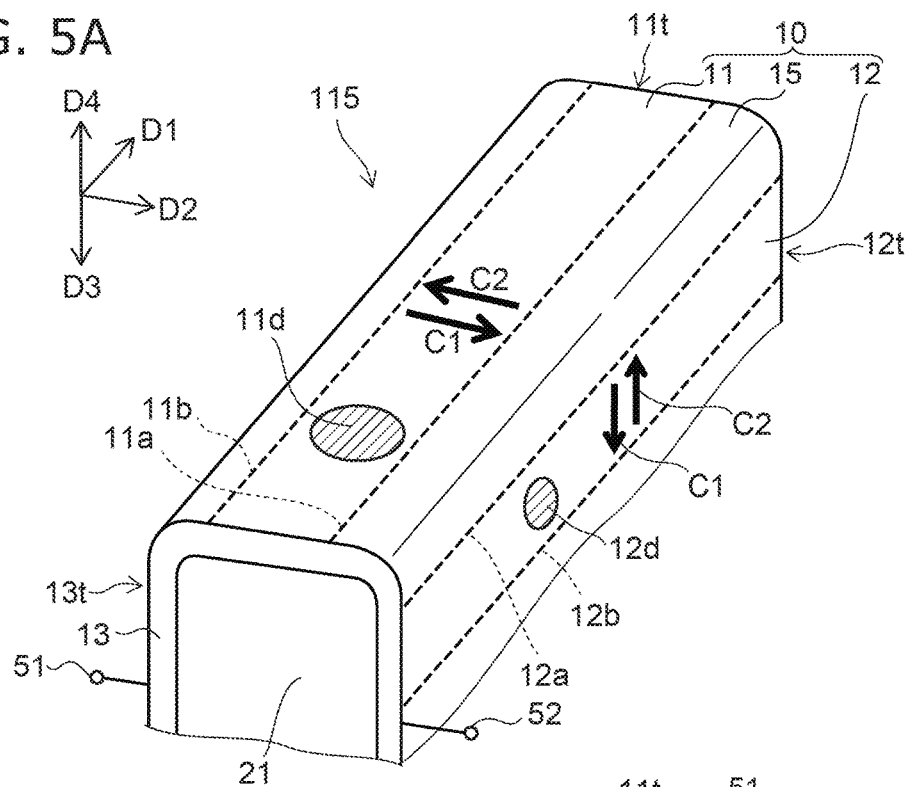
FIG. 5A and FIG. 5B are schematic views illustrating portions of other magnetic memory devices according to the first embodiment.
Figure 5B:
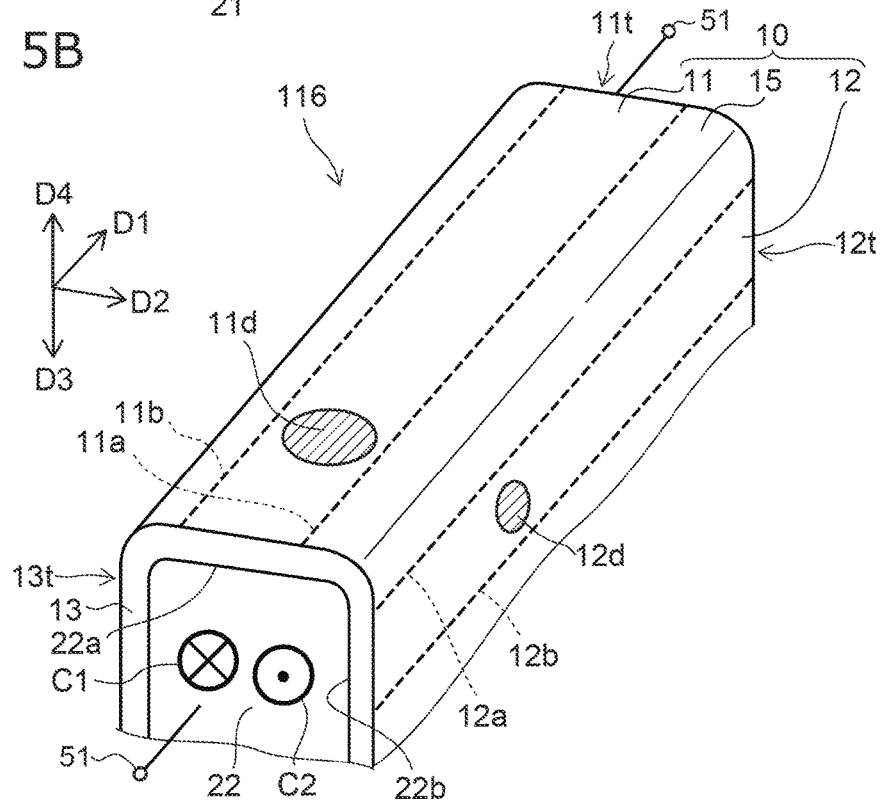

FIG. 5A and FIG. 5B are schematic views illustrating portions of other magnetic memory devices according to the first embodiment.

In these figures, the first counter body 31 and the controller 60 are omitted. In these examples, the second counter body 32 may be provided.

As shown in FIG. 5A, in one other magnetic memory device 115 according to the embodiment, arrangement of an electrode is different from the example of the magnetic memory device 110. Since other than this is the same as that of the magnetic memory device 110, description is omitted.

In the magnetic memory device 115, the first electrode 51 and the second electrode 52 are provided. The second electrode 52 is separated from the first electrode 51 in the second direction D2. The first electrode 51 and the second electrode 52 are electrically connected to the magnetic body 10.

The position of the first extending region 11 in the second direction D2 is disposed between the position of the first electrode 51 in the second direction D2 and the position of the second electrode 52 in the second direction D2. The position of the second extending region 12 in the second direction D2 is disposed between the position of the first extending region 11 in the second direction D2 and the position of the second electrode 52 in the second direction D2.

Current (current c1 and current c2) flows through the first extending region 11 along the second direction D2, The current flows through the second extending region 12 along the third direction D3.

The first magnetic domain 11d moves along the first direction D1 in the first extending region 11 according to the current (current c1 and c2) which flows through the first extending region 11, This current flows through the first extending region 11 along the second direction D2. Thus, in the embodiment, the current may flow along the second direction D2.

In the magnetic memory device 115, the base body 21 is insulative. An electrode is electrically connected to the magnetic body 10, and the current flows through the magnetic body 10.

As shown in FIG. 5B, in one other magnetic memory device 116 according to the embodiment, the base body 22 is conductive. Since other than this is the same as that of the magnetic memory device 110, description is omitted.

In this example, the first extending region 11 is provided on a first face 22a of the base body 22. The second extending region 12 is provided on a second face 22b of the base body 22.

For example, the first electrode 51 is connected to one end of the base body 22. The second electrode 52 is connected to one other end of the base body 22. The first electrode 51 and the second electrode 52 send current through the base body 22.

By current (current c1 and c2), the first magnetic domain 11d (portion of the plurality of magnetic domains 10d) moves along the first direction D1 in the first extending region 11. By the current (current c1 and c2), the second magnetic domain 12d (portion of the plurality of magnetic domains 10d) moves along the first direction D1 in the second extending region 12.

Also in the magnetic memory devices 115 and 116, the first magnetic domain 11d is suppressed from moving to the second extending region 12. The memory density can be improved.

Figure 6A:
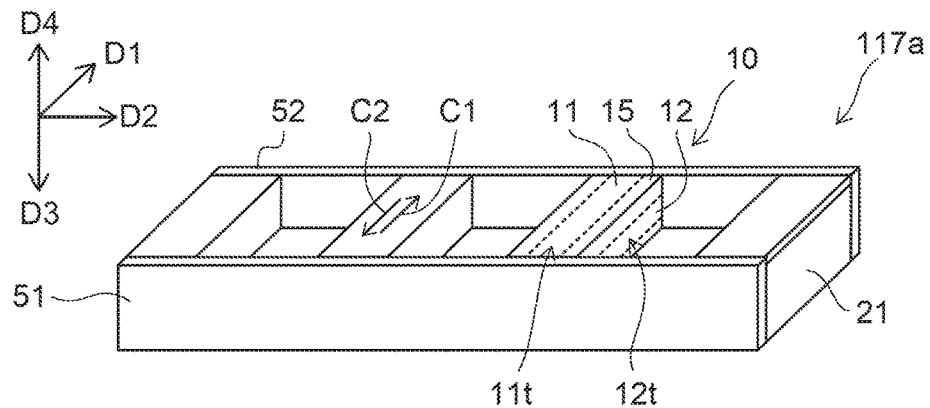
FIG. 6A to FIG. 6C are schematic views illustrating portions of other magnetic memory devices according to the first embodiment.
Figure 6B:
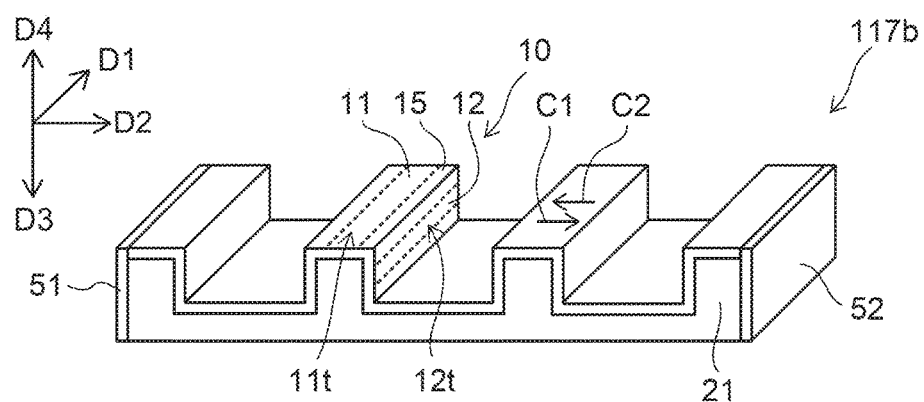
Figure 6C:
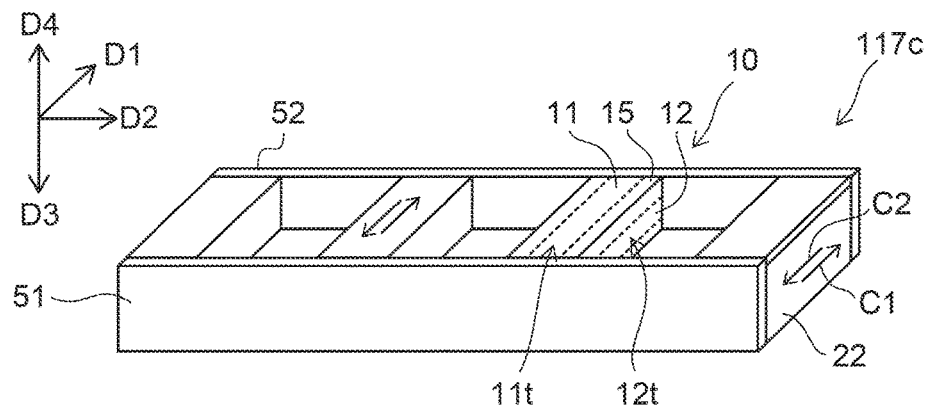

FIG. 6A to FIG. 6C are schematic views illustrating portions of other magnetic memory devices according to the first embodiment.

In these figures, the first counter body 31 and the controller 60 are omitted. In these examples, the second counter body 32 may be provided.

As shown in FIG. 6A, in a magnetic memory device 117a, the structure described about the magnetic memory device 110 is repeatedly provided along the second direction D2.

As shown in FIG. 6B, in a magnetic memory device 117b, the structure described about the magnetic memory device 115 is repeatedly provided along the second direction D2.

As shown in FIG. 6C, in a magnetic memory device 117c, the structure described about the magnetic memory device 116 is repeatedly provided along the second direction D2.

A memory capacity can be increased by providing the repeated structure. In a magnetic memory device, when a substrate is provided, the first direction D1 may be along the surface of the substrate.

Figure 7A:
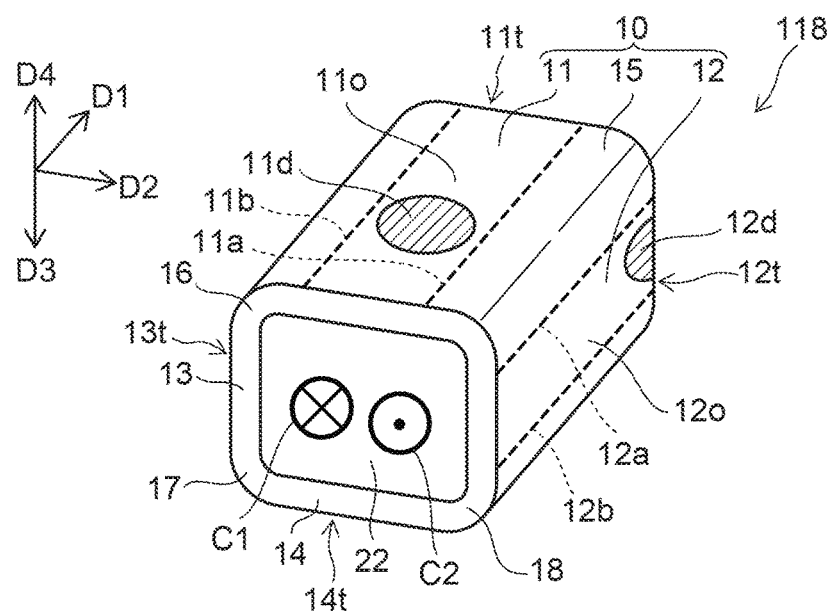
FIG. 7A and FIG. 7B are schematic perspective views illustrating portions of another magnetic memory device according to the first embodiment.
Figure 7B:
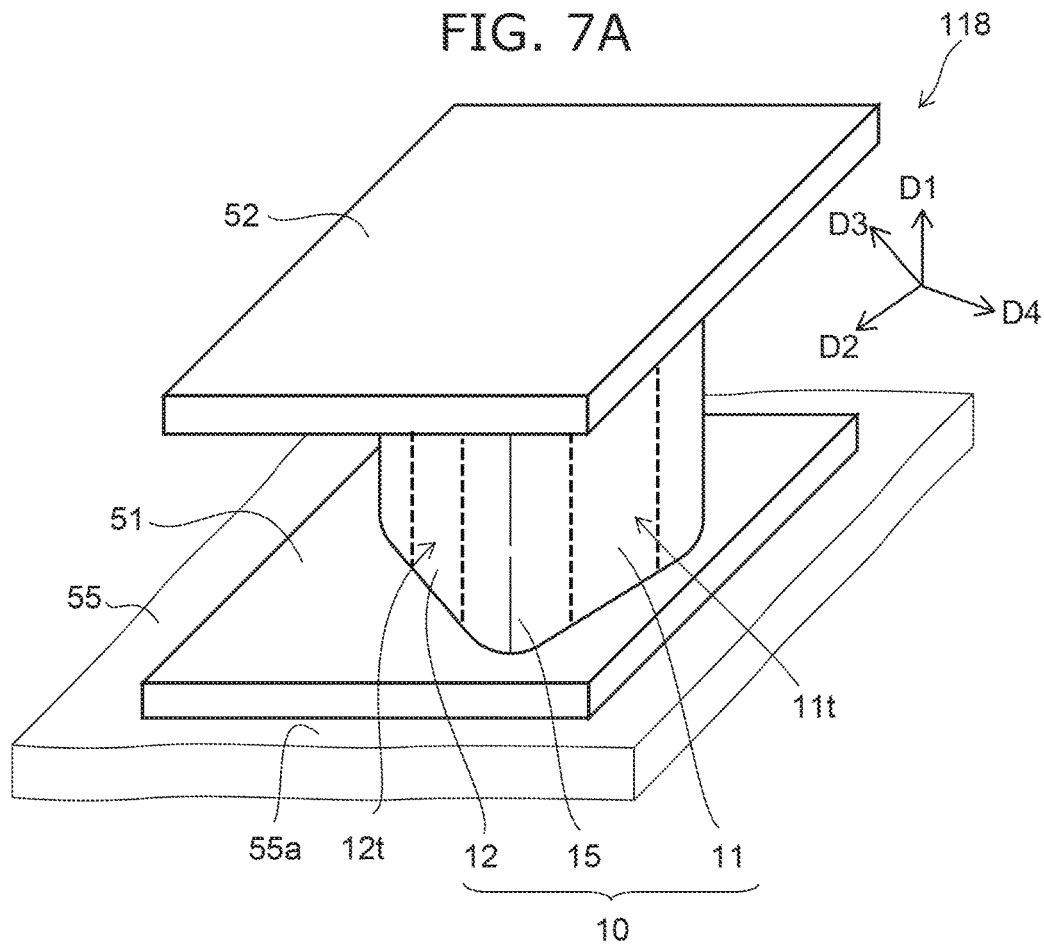

FIG. 7A and FIG. 7B are schematic perspective views illustrating portions of another magnetic memory device according to the first embodiment.

In these figures, the first counter body 31 and the controller 60 are omitted. In these examples, the second counter body 32 may be provided.

As shown in FIG. 7A, in a magnetic memory device 118 according to the embodiment, the magnetic body 10 includes the first extending region 11, the second extending region 12, and the first connecting region 15, and additionally further includes the third extending region 13, the fourth extending region 14, the second connecting region 16, a fourth connecting region 17, and a fourth connecting region 18.

In this example, the magnetic body 10 is quadratic prism-like substantially. The magnetic body 10 is pipe-like. The magnetic body 10 is provided in the surroundings of the base body 22. In this example, the base body 22 is conductive.

In this example, the third extending region 13 is separated from the second extending region 12 in the second direction D2. The fourth extending region 14 is separated from the first extending region 11 in the fourth direction D4. The second connecting region 16 connects the third extending region 13 to the first extending region 11. The third connecting region 17 connects the fourth extending region 14 to the third extending region 13. The fourth connecting region 18 connects the fourth extending region 14 to the second extending region 12.

As shown in FIG. 7B, a substrate 55 may be provided in the magnetic memory device 118. For example, the first direction D1 may be substantially perpendicular to the face 55a of the substrate 55. For example, the magnetic body 10 extends perpendicularly to the face 55a.

For example, the first electrode 51 is provided between the second electrode 52 and the substrate 55. The magnetic body 10 is provided between the second electrode 52 and the first electrode 51.

In the example of the magnetic memory device 118, the number of extending region extended along the first direction D1 is 4. In the embodiment, this number is arbitrary. This number may be three, for example. This number may be five or more.

Figure 8A:
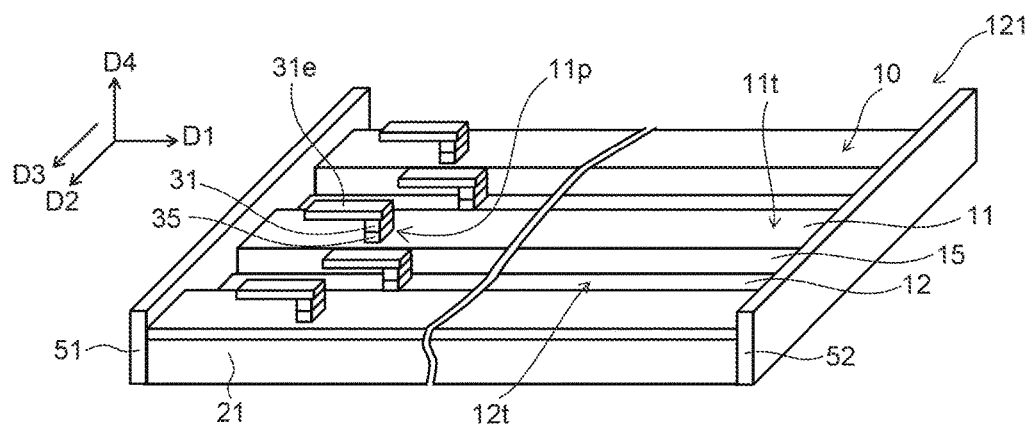
FIG. 8A and FIG. 8B are schematic perspective views illustrating portions of other magnetic memory devices according to the first embodiment.
Figure 8B:
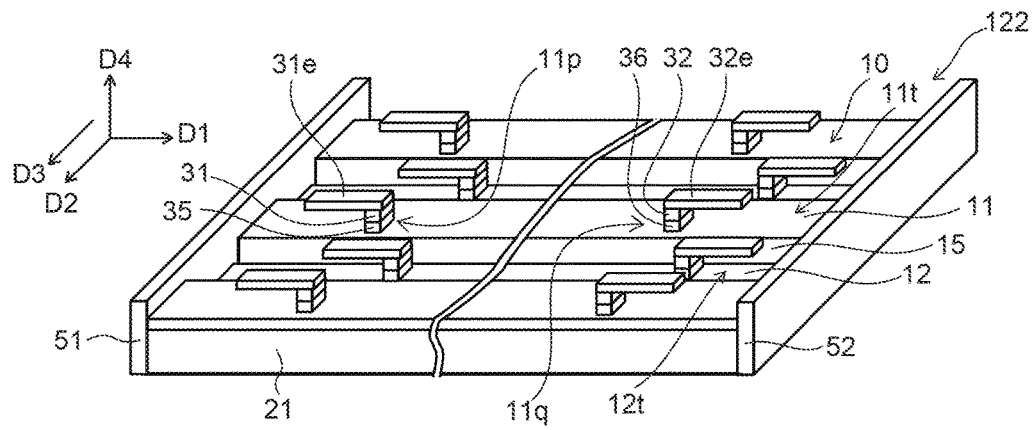

FIG. 8A and FIG. 8B are schematic perspective views illustrating portions of other magnetic memory devices according to the first embodiment.

The controller 60 is omitted in these figures.

As shown in FIG. 8A, in one other magnetic memory device 121 according to the embodiment, the second electrode 52 is separated from the first electrode 51 in the first direction D1. The first counter body 31 is provided between an interconnect 31e and the first extending region 11 (the first part 11p). The first intermediate layer 35 is provided between the first counter body 31 and the first part 11p. The interconnect 31e is electrically connected to the first counter body 31.

Similarly, another interconnect, another counter body, and another intermediate layer are provided also in the second extending region 12.

In the magnetic memory device 121, the first counter body 31 performs the reading operation and the recording operation, for example. The recording operation includes the erasing operation.

As shown in FIG. 8 (b), also in one other magnetic memory device 122 according to the embodiment, the second electrode 52 is separated from the first electrode 51 in the first direction D1. Also in this case, the interconnect 31e, the first counter body 31, and the first intermediate layer 35 are provided. Furthermore, the second counter body 32 is provided between an interconnect 32e and the first extending region 11 (the second part 11q). The second intermediate layer 36 is provided between the second counter body 32 and the second part 11q. The interconnect 32e is electrically connected to the second counter body 32.

Similarly, another interconnect, another counter body, and another intermediate layer are provided also in the second extending region 12.

In the magnetic memory device 122, the first counter body 31 performs the reading operation, for example. For example, the second counter body 32 performs the recording operation. The recording operation includes the erasing operation.

Figure 9A:
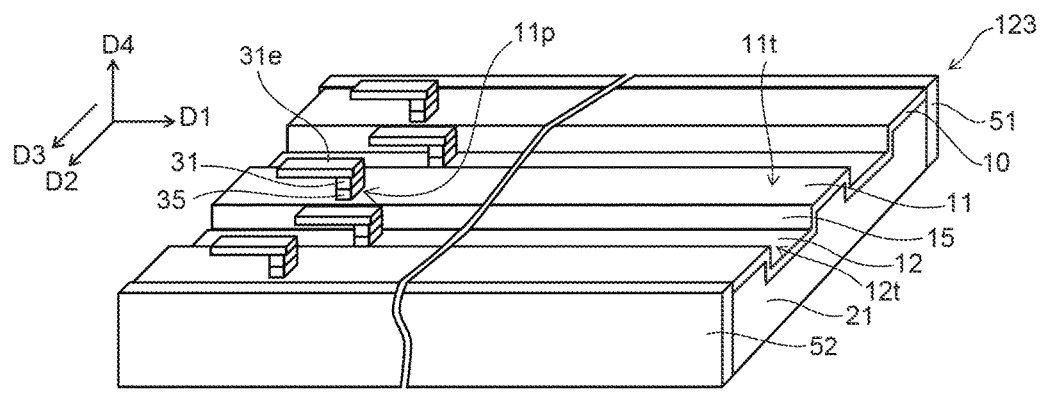
FIG. 9A and FIG. 9B are schematic perspective views illustrating portions of other magnetic memory devices according to the first embodiment.
Figure 9B:
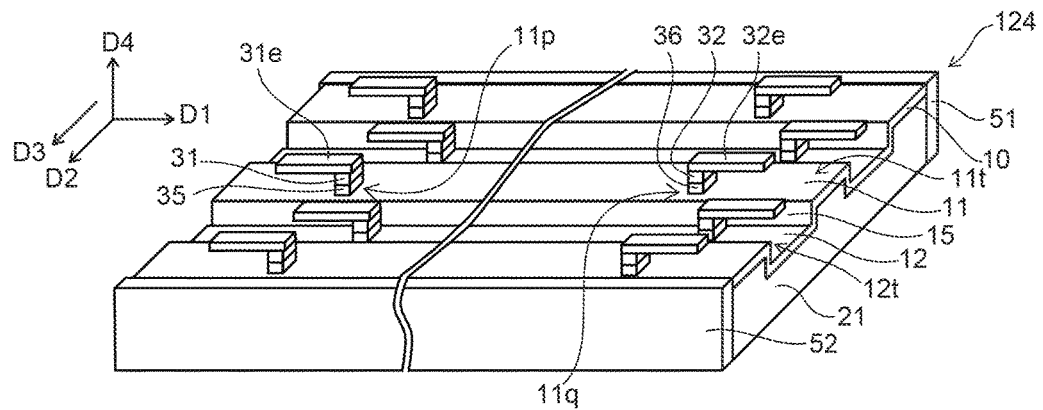

FIG. 9A and FIG. 9B are schematic perspective views illustrating portions of other magnetic memory devices according to the first embodiment.

The controller 60 is omitted in these figures.

As shown in FIG. 9A and FIG. 9B, in other magnetic memory devices 123 and 124 according to the embodiment, the second electrode 52 is separated from the first electrode 51 in the second direction D2.

The interconnect, the counter body and the intermediate layer in the magnetic memory device 123 are the same as those in the magnetic memory device 121. In the magnetic memory device 123, the first counter body 31 performs the reading operation and the recording operation, for example. The recording operation includes the erasing operation.

The interconnect, the counter body and the intermediate layer in the magnetic memory device 124 are the same as those in the magnetic memory device 122. In the magnetic memory device 124, the first counter body 31 performs the reading operation, for example. For example, the second counter body 32 performs the recording operation. The recording operation includes the erasing operation.

Figures 10A, 10B:
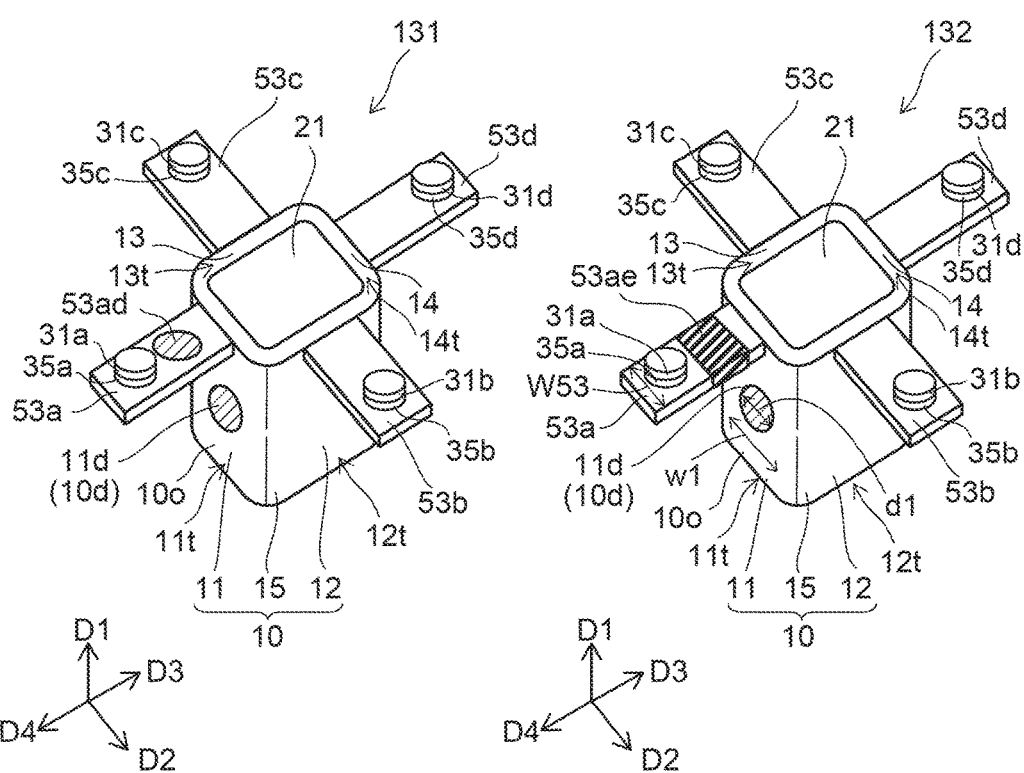
FIG. 10A and FIG. 10B are schematic perspective views illustrating portions of other magnetic memory devices according to the first embodiment.

FIG. 10A and FIG. 10B are schematic perspective views illustrating portions of other magnetic memory devices according to the first embodiment.

In these figures, the first counter body 31 and the controller 60 are omitted.

As shown in FIG. 10A, in one other magnetic memory device 131 according to the embodiment, the first to fourth extending regions 11-14 are provided in the magnetic body 10. Furthermore, first to fourth control magnetic bodies 53a-53d, the first to fourth counter bodies 31a-31d, and the first to fourth intermediate layers 35a-35d are provided. The first control magnetic body 53a is connected to an end of the first extending region 11. The second control magnetic body 53b is connected to an end of the second extending region 12. The third control magnetic body 53c is connected to an end of the third extending region 13. The fourth control magnetic body 53d is connected to an end of the fourth extending region 14. The first intermediate layer 35a is provided between the first control magnetic body 53a and the first counter body 31a. The second intermediate layer 35b is provided between the second control magnetic body 53d and the second counter body 31b. The third intermediate layer 35c is provided between the third control magnetic body 53c and the third counter body 31c. The fourth intermediate layer 35d is provided between the fourth control magnetic body 53d and the fourth counter body 31d. The first to fourth counter bodies 31a-31d are magnetic, for example. The first to fourth counter bodies 31a-31d are magnetic layers, for example.

For example, these control magnetic bodies inject the magnetic domains 10d (the first magnetic domain 11d etc.) into each of the extending regions.

For example, a magnetic domain 53ad is formed in the first control magnetic body 53a. This magnetic domain 53ad is injected into the first extending region 11. The first magnetic domain 11d is generated in the first extending region 11.

As shown in FIG. 10B, also in one other magnetic memory device 132 according to the embodiment, the first to fourth control magnetic bodies 53a-53d, the first to fourth counter bodies 31a-31d, and the first to fourth intermediate layers 35a-35d are provided. In this example, a width w53 of the first control magnetic body 53a along the second direction D2 is smaller than the width (for example, the first distance w1) of the first extending region 11 along the second direction D2. A magnetic domain 53ae is formed in the first control magnetic body 53a. A width of magnetic domain 53ae along the second direction D2 is substantially the same as the width w53 of the first control magnetic body 53a along the second direction D2. Such the magnetic domain 53ae is injected into the first extending region 11. The first magnetic domain 11d is generated in the first extending region 11. For example, the first domain width d1 of the first magnetic domain 11d corresponds to the width w53.

In the magnetic memory device 131 and 132, the first electrode 51 is electrically connected with the magnetic body 10, for example. The second electrode is electrically connected with to the control magnetic body (at least one of the first to fourth control magnetic bodies 53a-53d), for example.

Hereinafter, an example of a method for manufacturing the magnetic memory device according to the embodiment is explained.

FIG. 11A to FIG. 11D are schematic perspective views illustrating the method for manufacturing the magnetic memory device according to the first embodiment by steps.

Figure 11A:
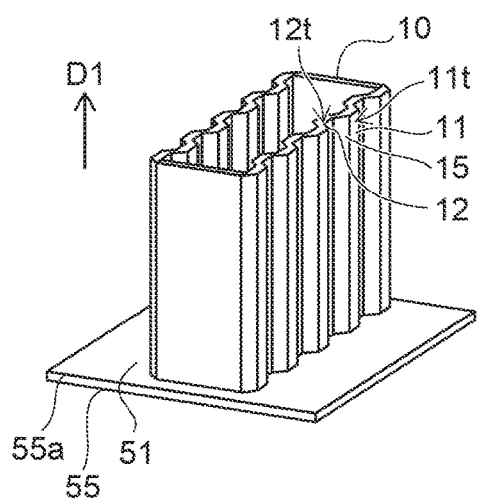
FIG. 11A to FIG. 11D are schematic perspective views illustrating a method for manufacturing the magnetic memory device according to the first embodiment by steps.

As shown in FIG. 11A, the first electrode 51 is formed on the face 55a of the substrate 55. The magnetic body 10 is formed on the first electrode 51. For example, a structure (for example, which may be the base body 21) which is not illustrated is formed, and a magnetic film is formed on a side surface of the structure. Thereby, the magnetic body 10 is formed. The first direction D1 is substantially perpendicular to the face 55a.

Figure 11B:
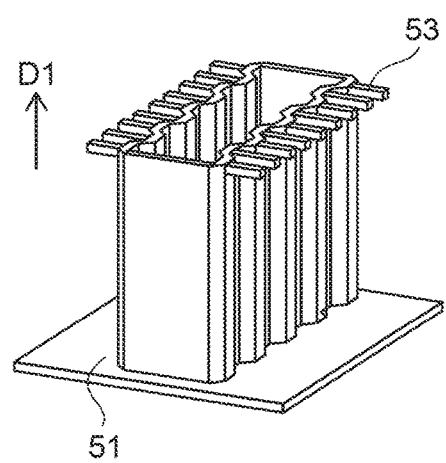
Figure 11C:
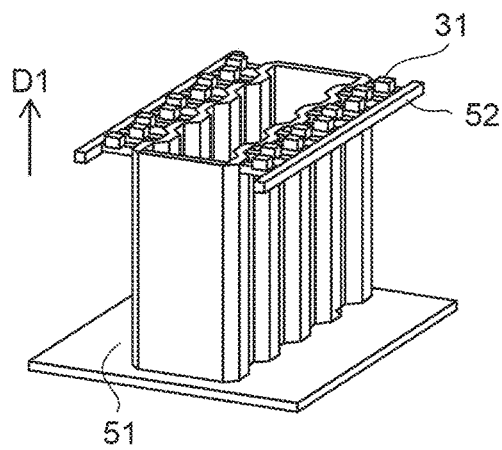
Figure 11D:
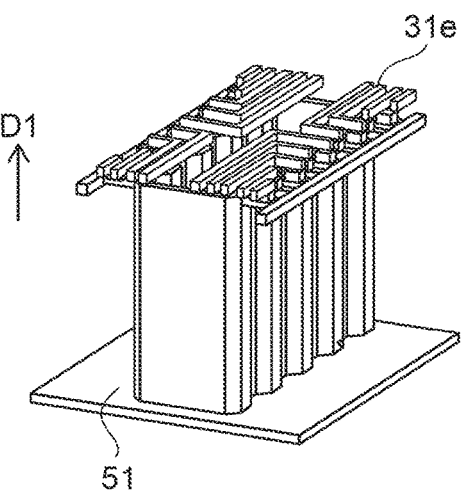

As shown in FIG. 11B, a plurality of the control/counter bodies 53 (for example, the first-fourth control magnetic bodies 53a-53d) are formed. As shown in FIG. 11C, the first counter bodies 31 (for example, the first-fourth counter bodies 31a-31d) are formed on each of the counter bodies 53. The second electrodes 52 electrically connected with each of the plurality of the control magnetic bodies 53 are formed. As shown in FIG. 11D, the interconnect 31e is formed on the first counter bodies 31. Various modifications are possible for the method for manufacturing the magnetic memory device according to the embodiment.

Second Embodiment

Figure 12A:
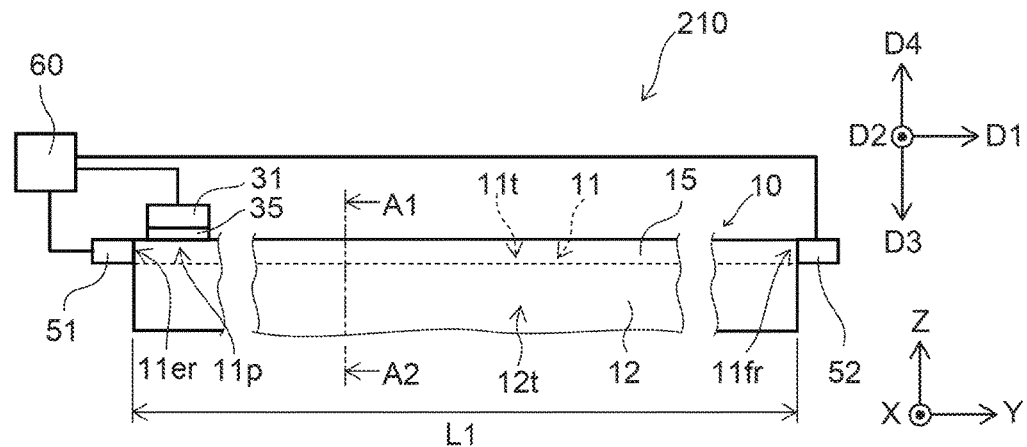
FIG. 12A to FIG. 12C are schematic views illustrating a magnetic memory device according to a second embodiment.
Figure 12B:
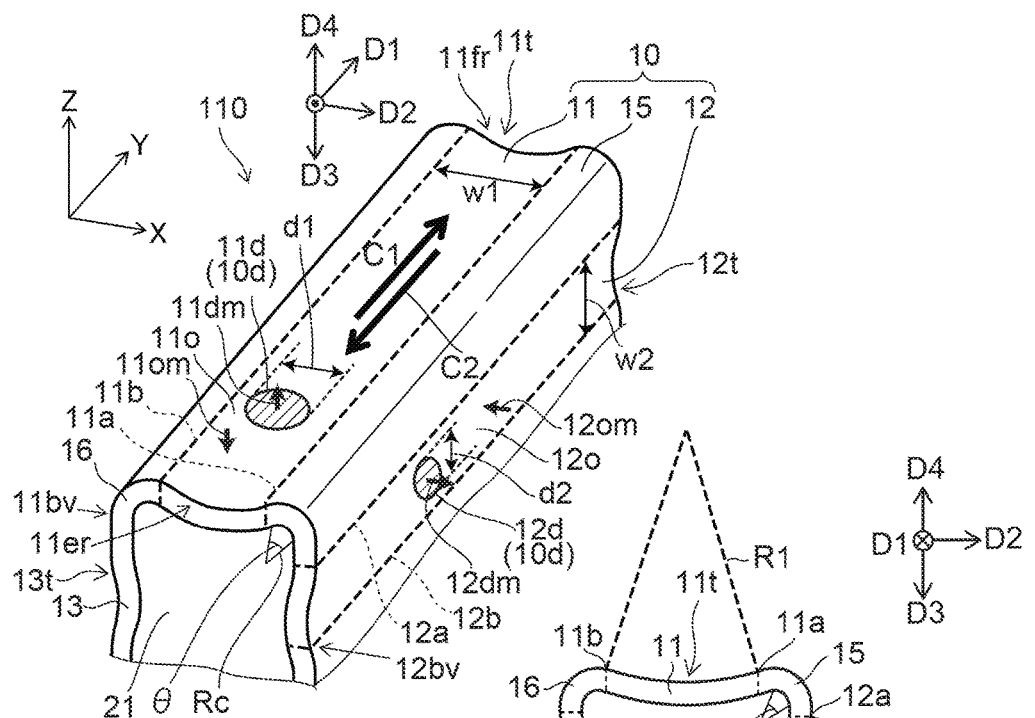
Figure 12C:
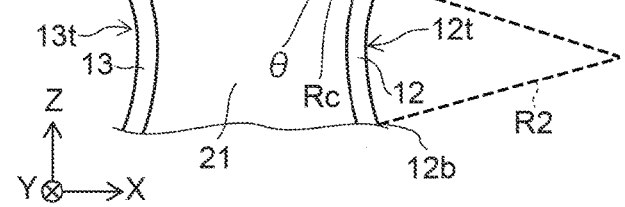

FIG. 12A to FIG. 12C are schematic views illustrating a magnetic memory device according to a second embodiment.

FIG. 12A is a side view. FIG. 12B is a perspective view showing a portion of the magnetic memory device. FIG. 12C is an A1-A2 line sectional view of FIG. 12A.

As shown in FIG. 12A, a magnetic memory device 210 according to the embodiment includes the magnetic body 10, the first electrode 51, the second electrode 52, the first counter body 31, and the controller 60. In the magnetic memory device 210, since the first electrode 51, the second electrode 52, the first counter body 31, and the controller 60 can be made to be the same as those of the magnetic memory device 110, the description is omitted. The configuration in which the description is omitted below is the same as that in the magnetic memory device 110, for example. Hereinafter, the magnetic body 10 in the magnetic memory device 210 is described.

FIG. 12B illustrates the magnetic body 10. The magnetic body 10 includes a plurality of extending regions. Each of these extending regions is curved surface. The plurality of extending regions are connected by the connecting region. The curvature radius of the extending regions is large. The curvature radius of the connecting region is smaller than the curvature radius of the extending region.

For example, in the magnetic body 10, the magnetic body 10 includes the first extending region 11, the second extending region 12, and the first connecting region 15.

The first extending region 11 extends along the first direction D1. The first extending region 11 includes the first end portion 11a and the second end portion 11b. The first end portion 11a extends in the first direction D1. The second end portion 11b extends in the first direction D1. The second end portion 11b is separated from the first end portion 11a in the second direction D2. The second direction D2 crosses the first direction D1.

The first extending region 11 is curved surface. The first extending region 11 has a first curvature radius R1. The first curvature radius R1 is a curvature radius of the first extending region 11 in a section of the first extending region 11 according to a perpendicular plane (this example X-Z plane) to the first direction D1.

The second extending region 12 extends along the first direction D1. The second extending region 12 includes the third end portion 12a and the fourth end portion 12b. The third end portion 12a extends in the first direction D1. The fourth end portion 12b extends in the first direction D2. In the third direction D3 crossing the first direction D1, the fourth end portion 12b is separated from the third end portion 12a.

In this example, the second extending region 12 is also curved surface. The second extending region 12 has a second curvature radius R2. The second curvature radius R2 is a curvature radius of the second extending region 12 in a section of the second extending region 12 according to a perpendicular plane (this example X-Z plane) to the first direction D1. In the embodiment, the second extending region 12 may be planate.

The first connecting region 15 is provided between the first end portion 11a and the third end portion 12a. The first connecting region 15 extends along the first direction D1, for example. The first connecting region 15 connects the first end portion 11a to the third end portion 12a. The first connecting region 15 has the connecting region curvature radius Rc. The connecting region curvature radius Rc is a curvature of the first connecting region 15 in a section of the first connecting region 15 by the section of the first connecting region 15 in the above-mentioned plane (X-Z plane in this example). The connecting region curvature radius Rc is smaller than the first curvature radius R1. The connecting region curvature radius Rc is smaller than the second curvature radius R2. That is, the second curvature radius R2 is larger than the connecting region curvature radius Rc.

The first extending region 11 is continuous with the first connecting region 15. The second extending region 12 is continuous with the first connecting region 15.

Also in this example, the magnetic body 10 is bent at the first connecting region 15. For example, the position 11bv of the second end portion 11b along the fourth direction D4 is different from the position 12bv of the fourth end portion 12b along the fourth direction D4. This fourth direction D4 is perpendicular to the first direction D1 and the second direction D2.

Also in this example, the first extending region 11 includes the first magnetic domain 10d and the first other region 10o in the first state. The first other region 10o is provided in the surroundings of the first magnetic domain 10d. The first magnetic domain 10d has the first domain width d1 along the second direction D2. The first extending region 11 has the first distance w1 (width). The first distance w1 is a distance between the first end portion 11a and the second end portion 11b along the second direction D2. The first domain width d1 is smaller than the first distance w1.

As shown in FIG. 12A, also in this example, the first counter body 31 is separated from the first part 11p of the first extending region 11 in the fourth direction D4. The first counter body 31 performs the reading operation. The first counter body 31 may perform the recording operation. The recording operation may include the erasing operation.

Also in the magnetic memory device 210, the position 11bv of the second end portion 11b is different from the position 12bv of the fourth end portion 12b. The connecting region curvature radius Rc is smaller than the first curvature radius R1, and smaller than the second curvature radius R2. The magnetic body 10 is bent at the first connecting region 15. Thereby, the magnetic domain 10d (for example, the first magnetic domain 11d) of one extending region is suppressed from moving to other extending region. Since the magnetic body 10 is continuous, manufacturing is easy. According to the embodiment, the memory density can be improved.

In the magnetic memory device 210, the second counter body 32 may be provided. In the magnetic memory device 210, the magnetization of the first extending region 11 is along a direction perpendicular to the first direction D1 and the second direction D2.

Figure 13A:
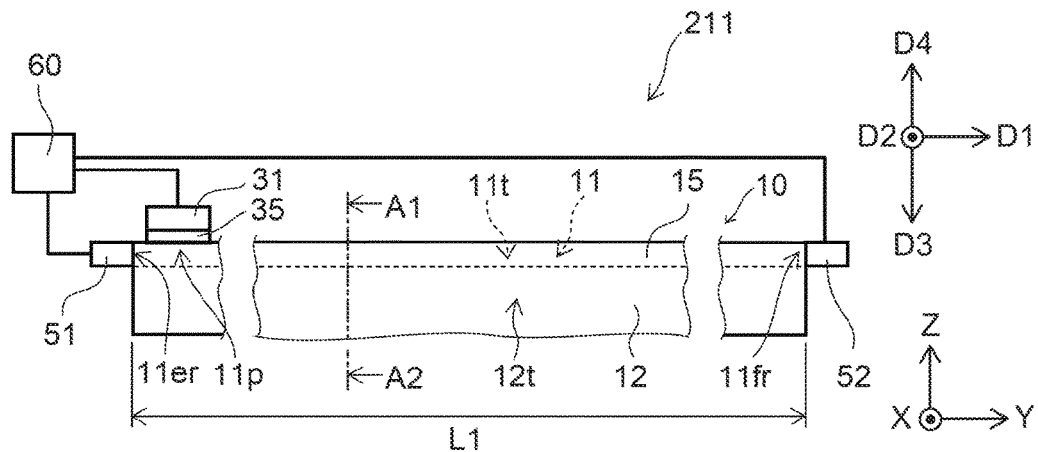
FIG. 13A to FIG. 13C are schematic views illustrating another magnetic memory device according to the second embodiment.
Figure 13B:
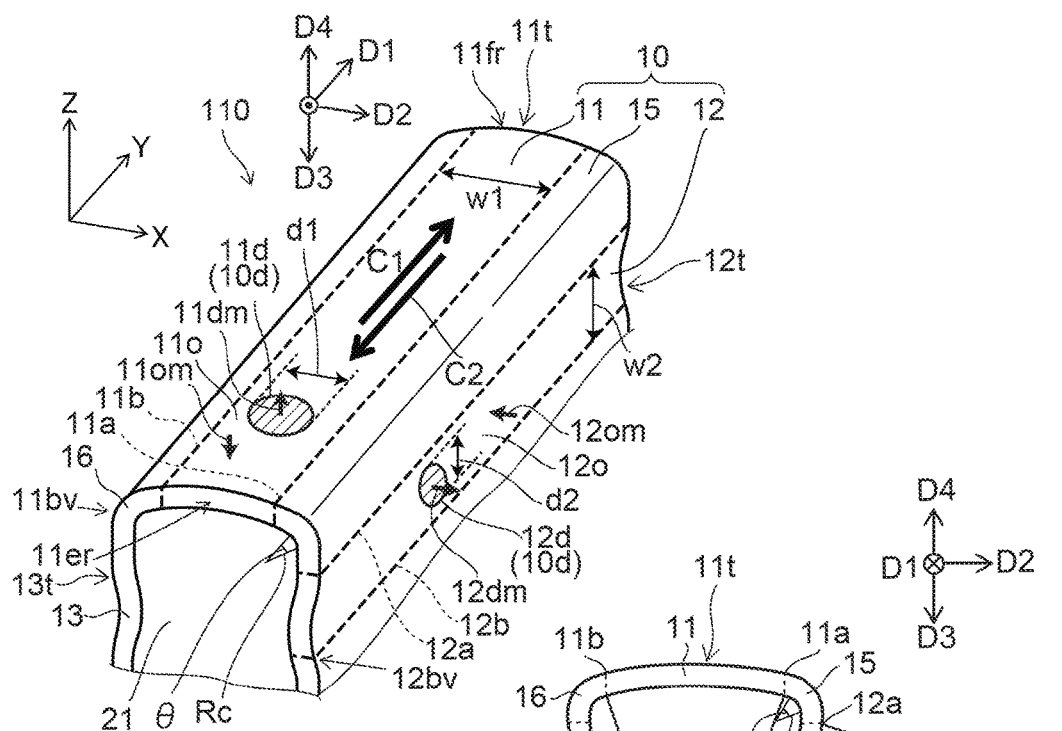
Figure 13C:
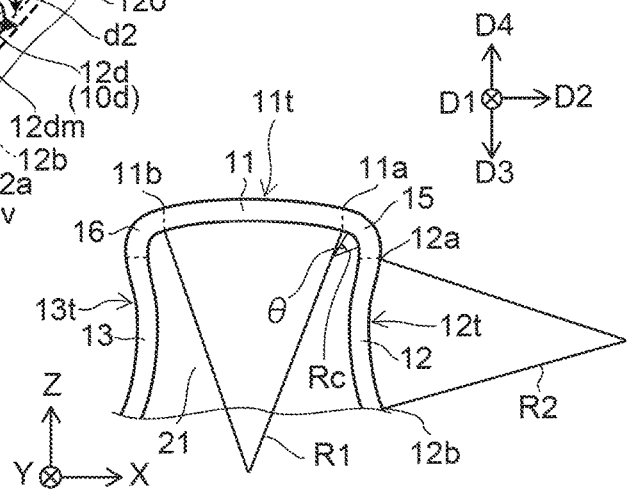

FIG. 13A to FIG. 13C are schematic views illustrating another magnetic memory device according to a second embodiment.

FIG. 13A is a side view. FIG. 13B is a perspective view showing a portion of the magnetic memory device. FIG. 13C is an A1-A2 line sectional view of FIG. 13A.

Also in a magnetic memory device 211 according to the embodiment, the extending region of the magnetic body 10 is curved surface. Like the magnetic memory devices 210 and 211, the first extending region 11 may be either concave or convex. In the magnetic memory device 211, the magnetization of the first extending region 11 is along a direction perpendicular to the first direction D1 and the second direction D2.

Third Embodiment

Figure 14A:
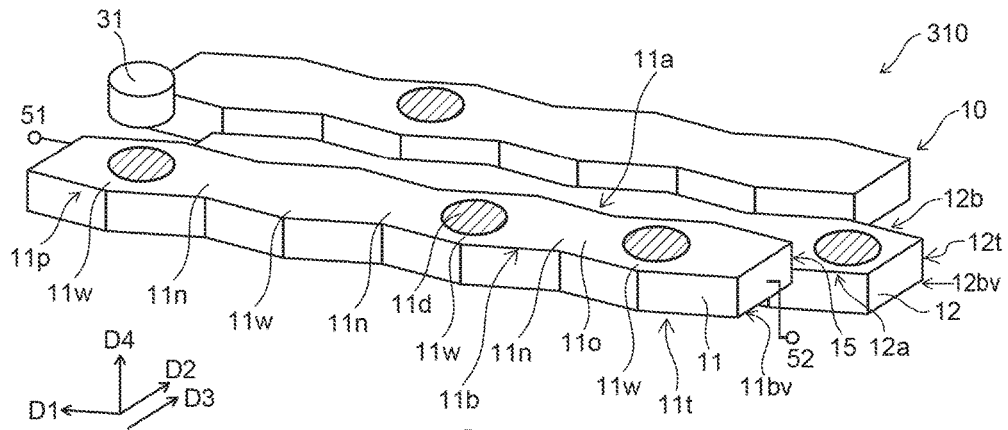
FIG. 14A to FIG. 14C are schematic views illustrating a magnetic memory device according to a third embodiment.
Figure 14B:
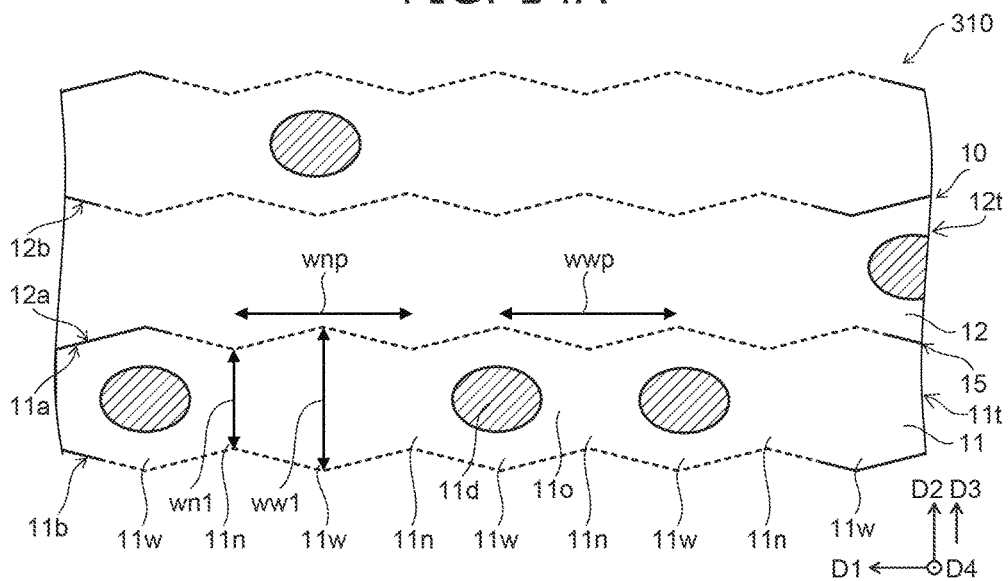
Figure 14C:
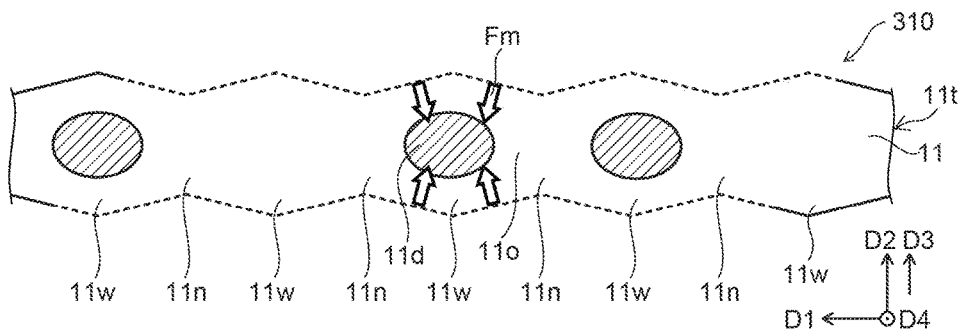

FIG. 14A to FIG. 14C are schematic views illustrating a magnetic memory device according to a third embodiment.

FIG. 14A is a perspective view. FIG. 14B and FIG. 14C are plan views showing a portion of the magnetic memory device.

As shown in FIG. 14A, a magnetic memory device 310 according to the embodiment includes the magnetic body 10, the first electrode 51, the second electrode 52, and the first counter body 31. In the magnetic memory device 310, at least one of the controller 60 and the second counter body 32 may be provided. In the magnetic memory device 310, since the first electrode 51, the second electrode 52, and the first counter body 31 can be made to be the same as those of the magnetic memory device 110, the description is omitted. The configuration in which the description is omitted below is the same as that in the magnetic memory device 110, for example. Hereinafter, the magnetic body 10 in the magnetic memory device 310 is explained.

Also in this example, the magnetic body 10 includes the first extending region 11, the second extending region 12, and the first connecting region 15. In the magnetic memory device 310, the first extending region 11, the second extending region 12, and the first connecting region 15 have the configuration described regarding to the magnetic memory device 110 or the magnetic memory device 210. Furthermore, in the magnetic memory device 310, the width of the extending region changes along the first direction D1.

As shown in FIG. 14A and FIG. 14B, the first extending region 11 includes a plurality of wide regions 11w and a plurality of narrow regions 11n. The plurality of wide regions 11w and the plurality of narrow regions 11n are alternately arranged along the first direction D1.

Each of plurality of wide regions 11w has a width ww1 along the second direction D2. Each of the plurality of narrow regions 11n has a width wn1 along the second direction D2. The width ww1 is larger than the width wn1.

The width wn1 of each of the plurality of narrow regions 11n along the second direction D2 is larger than the first domain width d1, for example. The width ww1 of each of the plurality of wide regions 11w along the second direction D2 may be not more than 7.5 times the first domain width d1, for example.

In this example, a pitch wwp of the plurality of wide regions 11w is substantially the same as a pitch wnp of the plurality of narrow regions 11n.

It becomes easy to control the position of the first magnetic domain 11d by providing the wide regions 11w and the narrow regions 11n.

As shown in FIG. 14C, a binding force Fm acts on the first magnetic domain 11d in the wide region 11w. For example, when the first magnetic domain 11d moves in the first extending region 11, it becomes easy to control the position of first magnetic domain 11d along the first direction D1.

Also in the magnetic memory device 310, the position 11bv of the second end portion 11b is different from the position 12bv of the fourth end portion 12b. The magnetic body 10 is bent at the first connecting region 15. Thereby, the magnetic domain 10d (for example, the first magnetic domain 11d) of one extending region is suppressed from moving to other extending region. Since the magnetic body 10 is continuous, manufacturing is easy. According to the embodiment, the memory density can be improved. Furthermore, the accuracy of the position of the first magnetic domain 11d is high. The stable operation is obtained.

Fourth Embodiment

Figure 15A:
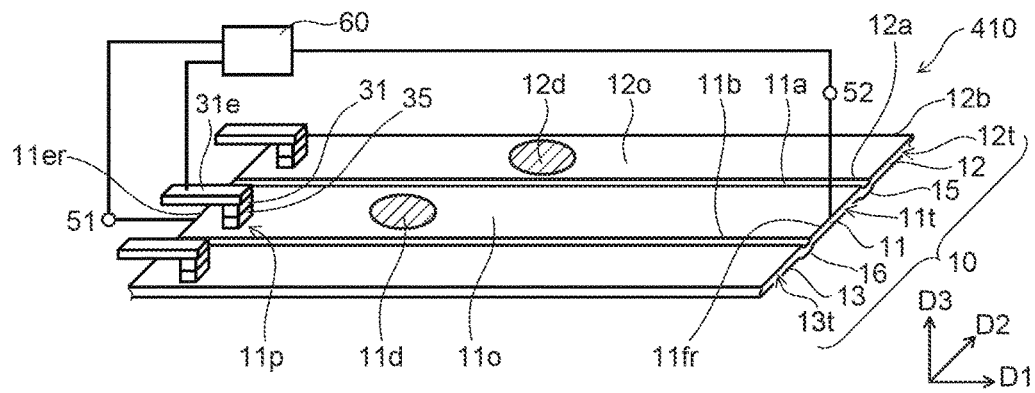
FIG. 15A to FIG. 15C are schematic views illustrating a magnetic memory device according to a fourth embodiment.
Figure 15B:
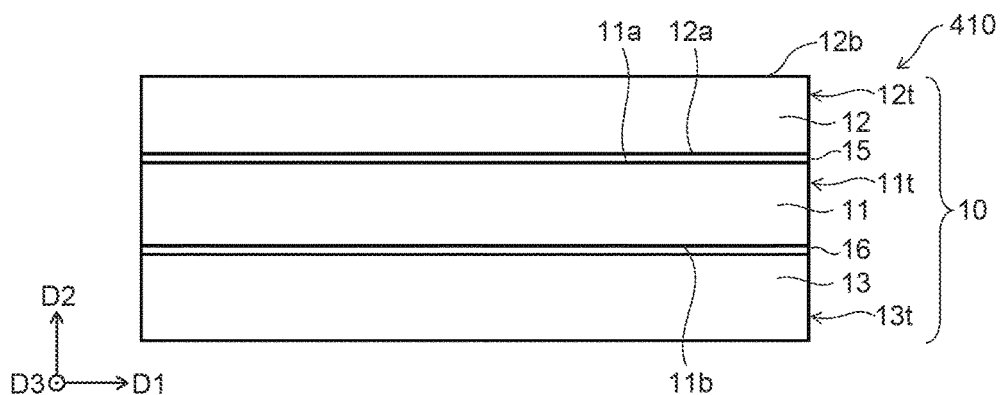
Figure 15C:
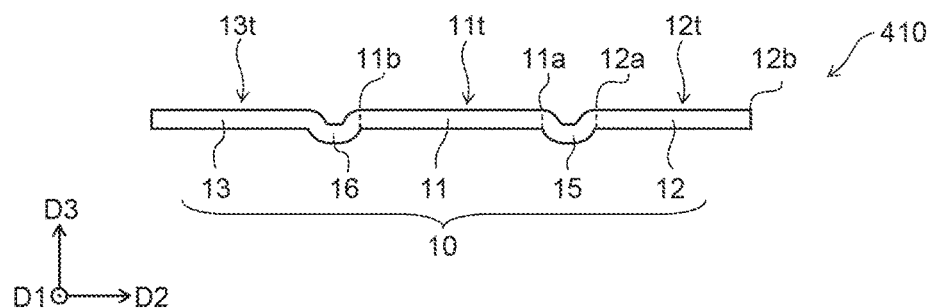

FIG. 15A to FIG. 15C are schematic views illustrating a magnetic memory device according to a fourth embodiment.

FIG. 15A is a perspective view. FIG. 15B is a plan view showing a portion of the magnetic memory device. FIG. 15C is a sectional view showing a portion of the magnetic memory device.

As shown in FIG. 15A, a magnetic memory device 410 according to the embodiment includes the magnetic body 10, the first electrode 51, the second electrode 52, the first counter body 31, and the controller 60. FIG. 15B and FIG. 15C show an example of the magnetic body 10.

The magnetic body 10 includes a first extending region 11, a second extending region 12, and a first connecting region 15. In this example, the magnetic body 10 further includes a third extending region 13 and a second connecting region 16.

The first and second extending regions 11 and 12 extend in the first direction D1. The second extending region 12 is arranged with the first extending region 11 in a second direction D2 crossing the first direction D1. The first connecting region 15 connects the first extending region 11 with the second extending region 12. For example, at least a part of the first extending region 11 spreads along the first direction D1 and a second direction D2. The second direction crosses the first direction D1. For example, at least a part of the second extending region 12 spreads along the first direction D1 and a second direction D2.

The first connecting region 15 extends along the first direction D1, for example. The first connecting region 15 recesses or protrudes with respect to the first extending regions 11 and recesses or protrudes with respect to the second extending region 12. For example, a surface (for example, an upper face in FIG. 15A) of the first connecting region 15 recesses with respect to a surface (a upper face) of the first extending region 11. Another surface (for example, a lower face in FIG. 15A) of the first connecting region 15 protrudes with respect to a surface (a lower face) of the first extending region 11. For example, a surface (for example, an upper face in FIG. 15A) of the first connecting region 15 recesses with respect to a surface (a upper face) of the second extending region 12. Another surface (for example, a lower face in FIG. 15A) of the first connecting region 15 protrudes with respect to a surface (a lower face) of the second extending region 12. The surface of the first connecting region 15 extends in the first direction D1. The surface of the first extending region 11 extends in the first direction D1. The surface of the second extending region 12 extends in the first direction D1.

For example, a direction perpendicular to the first direction D1 and second direction D2 is taken as a third direction D3. For example, a position of the upper face of the first connecting region 15 in the third direction D3 is different from a position of the upper face of the first extending region 11 in the third direction D3. The position of the upper face of the first connecting region 15 in the third direction D3 is different from a position of the upper face of the second extending region 12 in the third direction D3.

Also in this example, the first extending region 11 includes a first magnetic domain 11d and a first other region 11o in a first state. The first other region 11o is provided around the first magnetic domain 11d. The second extending region 12 includes a second magnetic domain 12d and a second other region 12o in another first state. The second other region 12o is provided around the second magnetic domain 12d.

The first counter body 31 is separated from a first part 11p of the first extending region 11. In this example, the first counter body 31 is separated from the a first part 11p of the first extending region 11 in the third direction D3. the first intermediate layer 35 is provided between the first counter body 31 and the first part 11p of the first extending region 11.

The third extending region 13 extends in the first direction D1. The second connecting region 16 extending in the first direction D1. The second connecting region 16 connects the third extending region 13 with the first extending region 11. The second connecting region 16 recesses or protrudes with respect to the first extending region 11 and recesses or protrudes with respect to the third extending region 13.

Thus, in the magnetic memory device 410, the connecting region recesses or protrudes with respect to the extending regions. Thereby, the magnetic domain 10d (for example, the first magnetic domain 11d) of one extending region is suppressed from moving to other extending region. Since the magnetic body 10 is continuous, manufacturing is easy. According to the embodiment, the memory density can be improved. Furthermore, the accuracy of the position of the first magnetic domain 11d is high. The stable operation is obtained.

Figure 16A:
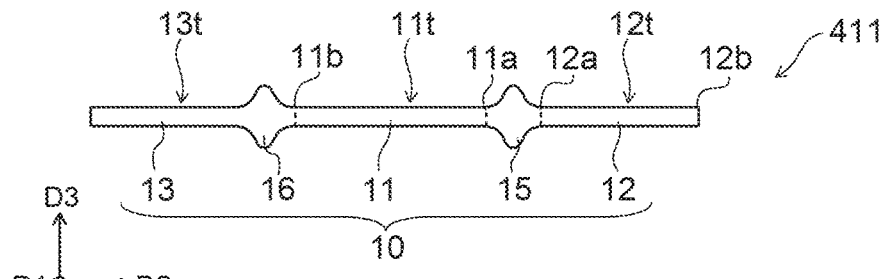
FIG. 16A and FIG. 16B are schematic cross-sectional views illustrating other magnetic memory devices according to the fourth embodiment.
Figure 16B:
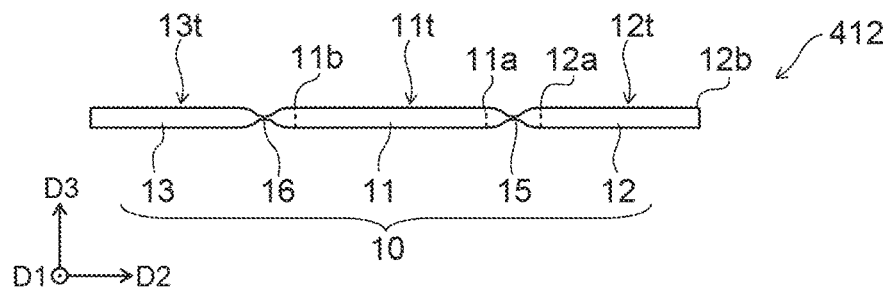

FIG. 16A and FIG. 16B are schematic sectional views illustrating other magnetic memory devices according to the fourth embodiment.

These figures show the magnetic bodies 10.

As shown in FIG. 16A, in a magnetic memory device 411, a thickness (a length in the third direction D3) of the first connecting region 15 is thicker than a thickness (a length in the third direction D3) of the first extending region 11. The thickness (a length in the third direction D3) of the first connecting region 15 is thicker than a thickness (a length in the third direction D3) of the second extending region 12.

As shown in FIG. 16B, in a magnetic memory device 412, the thickness (a length in the third direction D3) of the first connecting region 15 is thinner than the thickness (a length in the third direction D3) of the first extending region 11. The thickness (a length in the third direction D3) of the first connecting region 15 is thinner than the thickness (a length in the third direction D3) of the second extending region 12.

In the magnetic memory devices 411 and 412, the magnetic domain 10d (for example, the first magnetic domain 11d) of one extending region is suppressed from moving to other extending region. Thereby, the memory density can be improved.

Fifth Embodiment

Figure 17A:
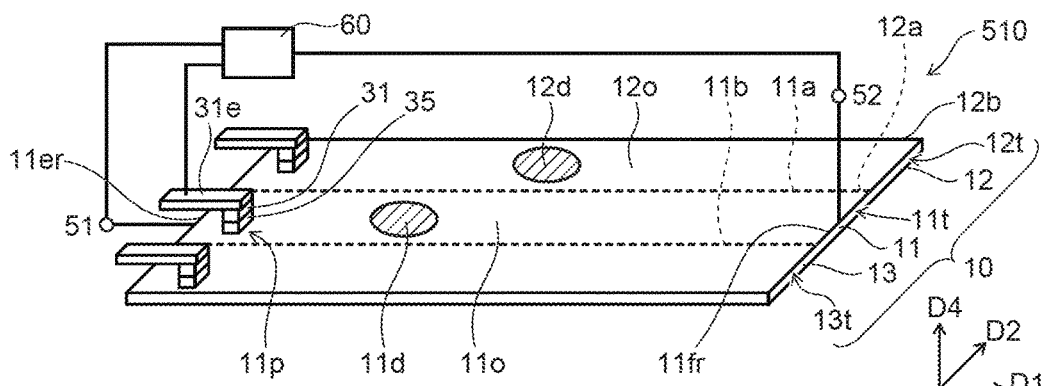
FIG. 17A and FIG. 17B are schematic views illustrating a magnetic memory device according to a fifth embodiment.
Figure 17B:
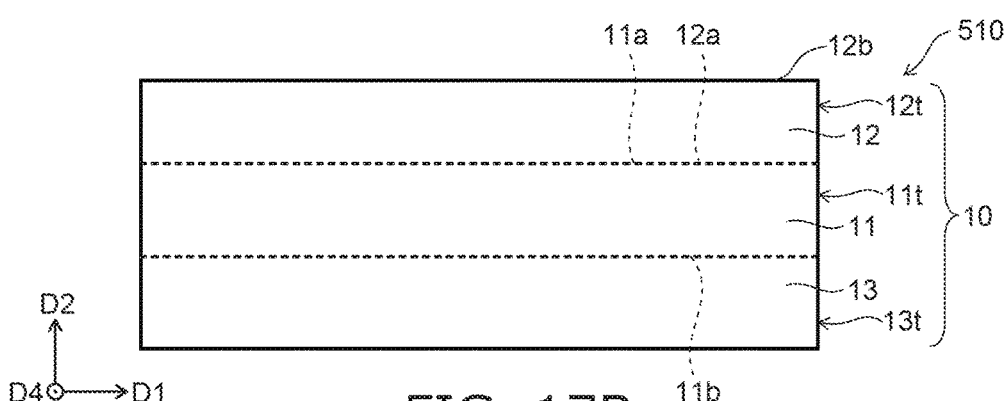

FIG. 17A to FIG. 17B are schematic views illustrating a magnetic memory device according to a fifth embodiment.

FIG. 17A is a perspective view. FIG. 17B is a plan view showing a portion of the magnetic memory device.

As shown in FIG. 17A, a magnetic memory device 510 according to the embodiment includes the magnetic body 10, the first electrode 51, the second electrode 52, the first counter body 31, and the controller 60. FIG. 17B shows an example of the magnetic body 10.

The magnetic body 10 includes the first extending region 11 and the second extending region 12. In this example, the magnetic body 10 further includes the third extending region 13.

The first to third extending regions 11 to 13 extend in the first direction D1. The second extending region 12 is arranged with the first extending region 11 in the second direction D2. The second extending region 12 is disposed between the first extending region 11 and the third extending region 13.

A direction perpendicular to the first direction D1 and the second direction D2 is taken as the fourth direction D4. For example, the magnetic body 10 is a perpendicular magnetized film. The magnetization of the first extending region 11 is along the fourth direction D4. Magnetization of the second extending region 12 is also along the fourth direction D4.

The first extending region 11 has the first end region 11er and the second end region 11fr. The second end region 11fr is arranged with first end region 11er in the first direction D1.

Also in this example, the first extending region 11 includes the first magnetic domain 11d and the first other region 11o in the first state. The first other region 11o is provided around the first magnetic domain 11d. The second extending region 12 includes the second magnetic domain 12d and the second other region 12o in one state. The second other region 12o is provided in the surroundings of the second magnetic domain 12d.

The first electrode 51 is connected to the first end region 11er in this example. The second electrode 52 is connected to the second end region 11fr. From the first electrode 51 and the second electrode 52, a current is supplied to the first extending region 11. In this example, the current flows along the first direction D1. In the embodiment, the current may be sent along the second direction D2. At this time, the first extending region 11 is provided, for example, between the first electrode 51 and the second electrode 52. The second extending region 12 is provided between the first extending region 11 and the second electrode 52.

The first counter body 31 is separated from the first part 11p of the first extending region 11 in the fourth direction D4. The first counter body 31 performs the reading operation. The first counter body 31 may perform the recording operation. The recording operation may include the erasing operation.

The controller 60 is electrically connected to the first counter body 31, the first electrode 51, and the second electrode 52.

In a magnetic memory device 510, a material included in the second extending region 12 is different from a material included in the first extending region 11. For example, the second extending region 12 includes an element which is not substantially included in the first extending region 11. For example, a concentration of a first element in the second extending region 12 is different from a concentration of the first element in the first extending region 11. For example, the concentration of the element doped into the second extending region 12 is different from the concentration of the element doped into the first extending region 11. For example, characteristics of crystal in the second extending region 12 are different from characteristics of crystal in the first extending region 11. The characteristics of crystal include orientation of crystal. The characteristics of crystal include an average size of crystal grains. The characteristics of crystal include a distribution of amorphous domains, etc.

Thereby, for example, the first magnetic domain 11d of the first extending region 11 is suppressed from moving to the second extending region 12. Since the magnetic body 10 is continuous, manufacturing is easy. According to the embodiment, the memory density can be improved.

For example, a material included in the third extending region 13 is different from a material included in the second extending region 12. For example, the material included in the third extending region 13 may be substantially the same as the material included in the first extending region 11.

For example, the plurality of extending regions including a mutually different material may also be arranged in the direction crossing the extending direction of the extending regions. The magnetic domain 10d of one extending region is suppressed from moving to the next extending region. The memory density can be improved.

Figure 18:
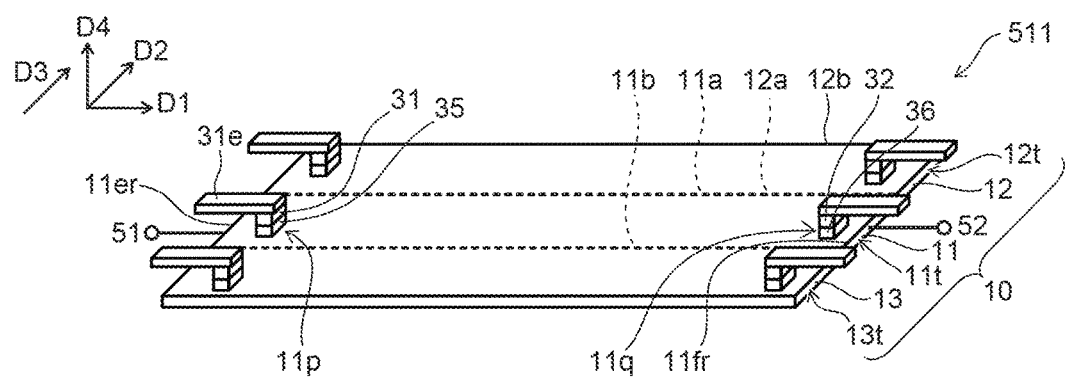
FIG. 18 is a schematic perspective view illustrating another magnetic memory device according to the fifth embodiment.

FIG. 18 is a schematic perspective view illustrating another magnetic memory device according to the fifth embodiment.

As shown in FIG. 18, the second counter body 32 is provided in a magnetic memory device 511 according to the embodiment. In this example, the second counter body 32 is provided between the interconnect 32e and the second part 11q of the first extending region 11. The second intermediate layer 36 is provided between the second counter body 32 and the second part 11q.

In the magnetic memory device 511, the second counter body 32 performs the recording operation, for example. The recording operation includes the erasing operation. The second counter body 32 performs at least one of the first operation and the second operation, for example. In the first operation, the second counter body 32 generates one other magnetic domain 11da in the first extending region 11 (same as FIG. 2C). The first other region 11o is further provided around the one other magnetic domain 11da. In the second operation, the second counter body 32 removes the first magnetic domain 11d from the first extending region 11 (same as FIG. 2D). Thereby, the state different from the first state is generated.

In the magnetic memory device 511, the first counter body 31 performs the reproduction operation. The first counter body 31 may further perform the recording operation. The recording operation may also include the erasing operation.

Figure 19:
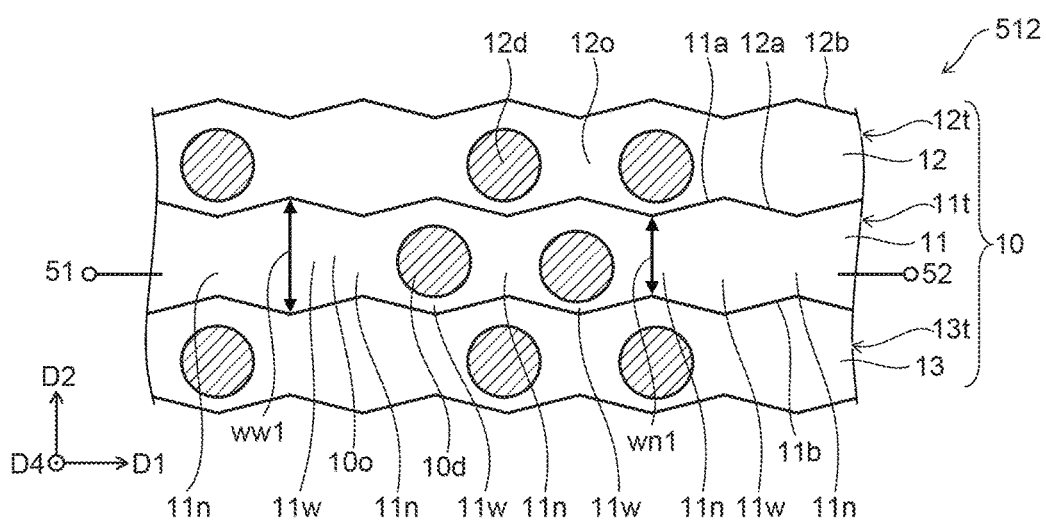
FIG. 19 is a schematic plan view illustrating another magnetic memory device according to the fifth embodiment.

FIG. 19 is a schematic plan view illustrating another magnetic memory device according to the fifth embodiment.

In FIG. 19, the first electrode 51, the second electrode 52, the first counter body 31, and the controller 60 are omitted. In this example, the second counter body 32 may be further provided.

FIG. 19 illustrates the magnetic body 10 in a magnetic memory device 512 according to the embodiment. In the magnetic body 10, the first extending region 11 includes the plurality of wide regions 11w and the plurality of narrow regions 11n. Other than this is the same as that of the magnetic memory device 510.

The plurality of wide regions 11w and the plurality of narrow regions 11n are alternately arranged along the first direction D1. Each of plurality of wide regions 11w has the width along the second direction D2. Each of the plurality of narrow regions 11n has the width wn1 along the second direction D2. The width ww1 is larger than the width wn1.

It becomes easy to control the position of the first magnetic domain 11d by providing the wide regions 11w and the narrow regions 11n. The memory density can be improved also in the magnetic memory device 512.

The embodiments includes following features:

(Feature 1) A magnetic shift register memory device, comprising:
a storage element to store a plurality of magnetic domains, the storage element comprising
a base body having a surface,
a magnetic body provided at the surface, the magnetic body having an easy magnetization substantially parallel to the normal to the surface, the magnetic body including;
a first magnetic track for the motion of a part of the magnetic domains, the first magnetic track comprising a first extending region spreading along a first direction and along a second direction crossing the first direction, the first extending region including a first end portion extending in the first direction and a second end portion extending in the first direction and being separated from the first end portion in the second direction,
a second magnetic track for the motion of another part of the magnetic domains, the second magnetic track comprising a second extending region spreading along the first direction and along a third direction crossing the first direction, the second extending region including a third end portion extending in the first direction and a fourth end portion extending in the first direction and being separated from the third end portion in the third direction, and
a first connecting region provided between the first end portion and the third end portion, the first connecting region connecting the first end portion with the third end portion,
a position of the second end portion along a fourth direction being different from a position of the fourth end portion along the fourth direction, the fourth direction being perpendicular to the first direction and crossing the second direction, and
a source of electrical current, to provide an electrical current to the storage element, the electrical current being capable to induce the motion of at least one of the magnetic domains in the first magnetic track and to induce the motion of at least one of the magnetic domains in the second magnetic track, and
a first counter body separated from a first reading position of the magnetic body, the first counter body being configured to read a presence of one of the plurality of the magnetic domains at the first reading position.

(Feature 2) The magnetic shift register memory device according to feature 1, further comprising
a second counter body separated from a second reading position of the magnetic body, the second counter body being configured to read a presence of one of the plurality of the magnetic domains at the second reading position,
the first reading position being located in the first extending region, and the
the second reading position being located in the second extending region.

(Feature 3) The magnetic shift register memory device according to one of features 1 and 2, wherein the first counter body performs at least one of a first operation and a second operation,
the first counter body creates one of the magnetic domains at a first writing position in the magnetic body in the first operation to create a first state of the magnetization at the first writing position,
the first counter body removes one of the magnetic domains at a first removing position in the magnetic body in a second operation to create a second state of the magnetization, the second state being different from the first state.

(Feature 4) The magnetic shift register memory device according to one of features 1-3, further comprising a third counter body to perform at least one of a third operation and a fourth operation, the third counter body creates one of the magnetic domains at a second writing position in the magnetic body in the first operation to create a third state of the magnetization at the second writing position, the third counter body removes one of the magnetic domains at a second removing position in the magnetic body in a second operation to create a fourth state of the magnetization, the fourth state being different from the third state.

(Feature 5) The magnetic shift register memory device according to features 1-4, wherein the base body is an electrical insulator.

(Feature 6) The magnetic shift register memory device according to features 1-4, wherein the base body is an electrical conductor.

(Feature 7) The magnetic shift register memory device according to one of features 1-6, wherein the third direction crosses the second direction.

(Feature 8) The magnetic shift register memory device according to features 7, wherein an angle between the second direction and the third direction is not larger than 90 degrees.

(Feature 9) The magnetic shift register memory device according to one of features 1-6, wherein the third direction aligns along the second direction, and at least a part of the second extending region overlaps the first extending region in the fourth direction.

(Feature 10) The magnetic shift register memory device according to one of features 1-6, wherein the third direction aligns along the second direction, a position of the first end portion in the second direction is located between a position of the second end portion in the second direction and a position of the fourth end portion in the second direction.

(Feature 11) The magnetic shift register memory device according to one of features 10, wherein the fourth direction is perpendicular to the second direction.

(Feature 12) The magnetic shift register memory device according to feature 11, wherein the first connecting region includes a first curved part connected with the first end portion, a second curved part connected with the third end portion, and a connecting part provided between the first curved part and the second curved part, the connecting part connects the first curved part with the second curved part.

(Feature 13) A magnetic shift register memory device according to one of features 1-12, wherein the first extending region includes a plurality of wide regions and a plurality of narrow regions alternately arranged with the wide regions along the first direction, and a width of each of the wide regions in the second direction is wider than a width of each of the narrow regions in the first direction.

(Feature 14) The magnetic shift register memory device according to feature 4, the third counter body is magnetic and connected to the magnetic body at the second writing position.

(Feature 15) The magnetic shift register memory device according to feature 14, the second writing position is located the second extending region.

The embodiments includes following features:
(Configuration 1)
A magnetic memory device, comprising:
a magnetic body, the magnetic body including
a first extending region spreading along a first direction and along a second direction crossing the first direction, the first extending region including a first end portion extending in the first direction and a second end portion extending in the first direction and separated from the first end portion in the second direction,
a second extending region spreading along the first direction and along a third direction crossing the first direction, the second extending region including a third end portion extending in the first direction and a fourth end portion extending in the first direction and separated from the third end portion in the third direction, and
a first connecting region provided between the first end portion and the third end portion, the first connecting region connecting the first end portion with the third end portion,
a position of the second end portion along a fourth direction being different from a position of the fourth end portion along the fourth direction, the fourth direction being perpendicular to the first direction and the second direction, and
the first extending region including a first magnetic domain and a first other region provided around the first magnetic domain in a first state.

(Configuration 2)
The magnetic memory device according to configuration 1, wherein the third direction crosses the second direction.

(Configuration 3)
The magnetic memory device according to configuration 1 or 2, wherein an angle between the second direction and the third direction is not larger than 90 degrees.

(Configuration 4)
The magnetic memory device according to configuration 1, wherein
the third direction aligns along the second direction, and
at least a part of the second extending region overlaps the first extending region in the fourth direction.

(Configuration 5)
The magnetic memory device according to configuration 1, wherein
the third direction aligns along the second direction, and
a position of the first end portion in the second direction is located between a position of the second end portion in the second direction and a position of the fourth end portion in the second direction.

(Configuration 6)
The magnetic memory device according to configuration 5, wherein
the first connecting region includes
a first curved part connected with the first end portion,
a second curved part connected with the third end portion, and
a connecting part connected with the first curved part and the second curved part.

(Configuration 7)
A magnetic memory device comprising:
a first extending region extending along a first direction, the first extending region having a first curvature radius in a cross section of the first extending region by a plane perpendicular to the first direction;

a second extending region extending along the first direction and arranged with the first extending region in a second direction crossing the first direction; and a first connecting region extending in the first direction and connecting the first extending region with the second extending region, the first connecting region having a connecting region curvature radius in a cross section of the first connection region by the plane, the connecting region curvature radius being smaller than the first curvature radius, the first extending region including a first magnetic domain and a first other region provided around the first magnetic domain in a first state.

(Configuration 8)

A magnetic memory device comprising:

a first extending region extending along a first direction;

a second extending region extending along the first direction and arranged with the first extending region in a second direction crossing the first direction; and a first connecting region connecting the first extending region with the second extending region, the first connecting region recessing or protruding with respect to the first extending region and recessing or protruding with respect to the second extending region, and the first extending region including a first magnetic domain and a first other region provided around the first magnetic domain in a first state.

(Configuration 9)

The magnetic memory device according to one of configurations 1 to 8, further comprising: a first counter body separated from a first part of the first extending region, the first counter body being magnetic.

(Configuration 10)

The magnetic memory device according to configuration 9, wherein an electrical resistance between the first extending region and the first counter body in a state where the first magnetic domain is located at the first part is different from an electrical resistance between the first extending region and the first counter body in a state where the first other region is located at the first part.

(Configuration 11)

The magnetic memory device according to one of configurations 1 to 8, further comprising:

a first control magnetic body connected with the first extending region; and a first counter body opposing the first control magnetic body.

(Configuration 12)

The magnetic memory device according to one of configurations 9 to 11, wherein the first counter body performs at least one of a first operation or a second operation, the first counter body creates an other magnetic domain in the first extending region in the first operation, the first other region being provided further around the other magnetic domain, the first counter body removes the first magnetic domain from the first extending region to create a state different from the first state in the second operation.

(Configuration 13)

The magnetic memory device according to configuration 11, further comprising:

a first electrode electrically connected with the magnetic body; and a second electrode electrically connected with the first control magnetic body.

(Configuration 14)

The magnetic memory device according to one of configurations 1 to 9, further comprising:

a first electrode; and a second electrode, the first extending region including a first end region, and a second end region arranged with the first end region in the first direction, the first electrode being connected with the first end region, and the second electrode being connected with the second end region.

(Configuration 15)

The magnetic memory device according to one of configuration 13 or 14, wherein the first magnetic domain moves in the first extending region along the first direction depending on a current flowing in the first extending region, and the current flows in the first extending region along the first direction.

(Configuration 16)

The magnetic memory device according to one of configurations 1 to 9, further comprising a first electrode; and a second electrode, the first electrode and second electrode being electrically connected with the magnetic body, a position of the first extending region in the second direction being disposed between a position of the first electrode in the second direction and a position of the second electrode in the second direction, a position of the second extending region in the second direction being disposed between the position of the first extending region in the second direction and the position of the second electrode in the second direction.

(Configuration 17)

The magnetic memory device according to configuration 16, wherein the first magnetic domain moves in the first extending region along the first direction depending on a current flowing in the first extending region, and the current flows in the first extending region along the second direction.

(Configuration 18)

The magnetic memory device according to one of configurations 1 to 17, wherein a direction of a magnetization of the first magnetic domain is opposite to a direction of a magnetization of the first other region.

(Configuration 19)

The magnetic memory device according to one of configurations 1 to 18, wherein the first extending region has a magnetization along a direction perpendicular to the first direction and the second direction.

(Configuration 20)

The magnetic memory device according to one of configurations 1 to 19, wherein the first extending region includes a plurality of wide regions and a plurality of narrow regions alternately arranged with the wide regions along the first direction, and a width of each of the plurality of wide regions in the second direction is wider than a width of each of the plurality of narrow regions in the second direction.

According to the embodiment, the magnetic memory device with the improved memory density can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic bodies, counter bodies, intermediate layers, electrodes, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a magnetic body, the magnetic body including
      a first extending region, a first length of the first extending region along a first direction being longer than a second length of the first extending region along a second direction crossing the first direction, the first extending region including a first end portion extending in the first direction and a second end portion extending in the first direction and separated from the first end portion in the second direction,
      a second extending region, a third length of the second extending region along the first direction being longer than a fourth length of the second extending region along a third direction crossing the first direction, the second extending region including a third end portion extending in the first direction and a fourth end portion extending in the first direction and separated from the third end portion in the third direction, and
      a first connecting region provided between the first end portion and the third end portion, a length of the first connection region along the first direction being longer than a length of the first connection region along the second direction and longer than a length of the first connection region along the third direction, the first connecting region connecting the first end portion with the third end portion,
      a position of the second end portion along a fourth direction being different from a position of the fourth end portion along the fourth direction, the fourth direction being perpendicular to the first direction and the second direction, and
   the first extending region including a first magnetic domain and a first other region provided around the first magnetic domain in a first state.

2. The device according to claim 1, wherein the third direction crosses the second direction.

3. The device according to claim 1, wherein an angle between the second direction and the third direction is not larger than 90 degrees.

4. The device according to claim 1, wherein
   the third direction aligns along the second direction, and
   at least a part of the second extending region overlaps the first extending region in the fourth direction.

5. The device according to claim 1, wherein
   the third direction aligns along the second direction, and
   a position of the first end portion in the second direction is located between a position of the second end portion in the second direction and a position of the fourth end portion in the second direction.

6. The device according to claim 5, wherein
   the first connecting region includes
      a first curved part connected with the first end portion,
      a second curved part connected with the third end portion, and
      a connecting part connected with the first curved part and the second curved part.

7. The device according to claim 1, further comprising a first counter body separated from a first part of the first extending region, the first counter body being magnetic.

8. The device according to claim 7, wherein
   an electrical resistance between the first extending region and the first counter body in a state where the first magnetic domain is located at the first part is different from an electrical resistance between the first extending region and the first counter body in a state where the first other region is located at the first part.

9. The device according to claim 1, further comprising
   a first control magnetic body connected with the first extending region; and
   a first counter body opposing the first control magnetic body.

10. The device according to claim 7, wherein
    the first counter body performs at least one of a first operation or a second operation,
    the first counter body creates an other magnetic domain in the first extending region in the first operation, the first other region being provided further around the other magnetic domain,
    the first counter body removes the first magnetic domain from the first extending region to create a state different from the first state in the second operation.

11. The device according to claim 9, further comprising
    a first electrode electrically connected with the magnetic body; and
    a second electrode electrically connected with the first control magnetic body.

12. The device according to claim 1, further comprising
a first electrode; and
a second electrode,
the first extending region including
   a first end region, and
   a second end region arranged with the first end region in the first direction, the first electrode being connected with the first end region, and
the second electrode being connected with the second end region.

13. The device according to claim 11, wherein
the first magnetic domain moves in the first extending region along the first direction depending on a current flowing in the first extending region, and
the current flows in the first extending region along the first direction.

14. The device according to claim 1, further comprising:
a first electrode; and
a second electrode,
the first electrode and second electrode being electrically connected with the magnetic body,
a position of the first extending region in the second direction being disposed between a position of the first electrode in the second direction and a position of the second electrode in the second direction,
a position of the second extending region in the second direction being disposed between the position of the first extending region in the second direction and the position of the second electrode in the second direction.

15. The device according to claim 14, wherein
the first magnetic domain moves in the first extending region along the first direction depending on a current flowing in the first extending region, and
the current flows in the first extending region along the second direction.

16. The device according to claim 1, wherein a direction of a magnetization of the first magnetic domain is opposite to a direction of a magnetization of the first other region.

17. The device according to claim 1, wherein the first extending region has a magnetization along a direction perpendicular to the first direction and second direction.

18. The device according to claim 1, wherein
the first extending region includes a plurality of wide regions and a plurality of narrow regions alternately arranged with the wide regions along the first direction, and
a width of each of the wide regions in the second direction is wider than a width of each of the narrow regions in the second direction.

19. The device according to claim 1, wherein
the first length is longer than a length of the first extending region along the fourth direction, and
the third length is longer than a length of the second extending region along a direction perpendicular to the first direction and the third direction.

* * * * *